(12) United States Patent
Yokoyama

(10) Patent No.: US 7,791,122 B2
(45) Date of Patent: Sep. 7, 2010

(54) SEMICONDUCTOR MEMORY DEVICE

(75) Inventor: Takahiro Yokoyama, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 16 days.

(21) Appl. No.: 12/396,130

(22) Filed: Mar. 2, 2009

(65) Prior Publication Data

US 2009/0189209 A1    Jul. 30, 2009

Related U.S. Application Data

(60) Division of application No. 11/414,372, filed on May 1, 2006, now Pat. No. 7,514,737, which is a continuation of application No. 11/016,905, filed on Dec. 21, 2004, now Pat. No. 7,064,398.

(30) Foreign Application Priority Data

Dec. 26, 2003    (JP) ............................. 2003-433992

(51) Int. Cl.
*H01L 27/108* (2006.01)
*H01L 29/76* (2006.01)

(52) U.S. Cl. ..................... 257/296; 257/297; 257/379; 438/238

(58) Field of Classification Search ......... 257/296–297, 257/300, 379, 393, 368, 903, E29.345, E27.084; 438/238, 200
See application file for complete search history.

(56) References Cited

U.S. PATENT DOCUMENTS

| 5,145,799 | A | | 9/1992 | Rodder |
| 5,388,067 | A | * | 2/1995 | Sato et al. .................... 365/154 |
| 5,483,083 | A | * | 1/1996 | Meguro et al. ................ 257/69 |
| 6,479,860 | B2 | | 11/2002 | Ohbayashi |
| 6,737,712 | B2 | | 5/2004 | Hashimoto et al. |

FOREIGN PATENT DOCUMENTS

| JP | 6-151771 | 5/1994 |
| JP | 2002-76143 | 3/2002 |
| JP | 2002-83882 | 3/2002 |
| JP | 2003-297954 | 10/2003 |
| WO | WO 02/061840 A1 | 8/2002 |

OTHER PUBLICATIONS

Japanese Office Action, with English translation, issued in Japanese Patent Application No. 2003-433992, mailed Mar. 30, 2010.
Japanese Office Action issued in Japanese Patent Application No. 2003-433992, dated Aug. 25, 2009.

* cited by examiner

*Primary Examiner*—Theresa T Doan
(74) *Attorney, Agent, or Firm*—McDermott Will & Emery LLP

(57) ABSTRACT

In a full CMOS SRAM having a lateral type cell (memory cell having three partitioned wells arranged side by side in a word line extending direction and longer in the word line direction than in the bit line direction) including first and second driver MOS transistors, first and second load MOS transistors and first and second access MOS transistors, two capacitors are arranged spaced apart from each other on embedded interconnections to be storage nodes, with lower and upper cell plates cross-coupled to each other.

5 Claims, 16 Drawing Sheets

SEMICONDUCTOR MEMORY DEVICE

RELATED APPLICATIONS

This application is a Divisional of U.S. application Ser. No. 11/414,372, filed May 1, 2006 now U.S. Pat. No. 7,514,737, which is a Continuation of U.S. application Ser. No. 11/016,905, filed Dec. 21, 2004, now U.S. Pat. No. 7,064,398, claiming priority of Japanese Application No. 2003-433992, filed Dec. 26, 2003, the entire contents of each of which are hereby incorporated by reference.

BACKGROUND OF THE INVENTION

1. Field of the Invention

The present invention relates to semiconductor memory devices, and more particularly to a static random access memory (SRAM) having a structure provided with a memory cell including six metal oxide semiconductor (MOS) transistors (hereinafter, referred to as a "full CMOS cell") and enabling improvement of soft-error tolerance.

2. Description of the Background Art

With development of lower-voltage SRAM, an SRAM provided with full CMOS cells each including six MOS transistors (hereinafter, referred to as a "full CMOS SRAM") has become dominant.

Generally, a full CMOS cell is formed of two bulk access n-MOS transistors, two bulk driver n-MOS transistors and two bulk load p-MOS transistors.

The full CMOS cell exhibits relatively good soft-error tolerance. With downsizing of design rules, however, the cell size of the SRAM memory cell has increasingly been reduced. With lowering of the voltage, the charges (voltage× capacitance) accumulated in storage nodes of the SRAM memory cell have decreased, making a soft error a serious problem. As a result, in an SRAM operating with low voltage, it has become necessary to address such soft errors, even in the case of the full CMOS SRAM.

The soft error refers to a phenomenon in which data having been held is inverted for some reasons, which may include, for example, a noise due to an electron-hole pair that is generated when an α ray emitted from uranium (U) or thorium (Th) included in a package passes through a silicon substrate.

As the way of addressing the soft errors, for example, capacitance may be added to the storage nodes in an SRAM.

SRAM provided with such measures are described, for example, in Japanese Patent Laying-Open Nos. 06-151771 (conventional example 1) and 2002-083882 (conventional example 2).

The conventional example 1 discloses an SRAM wherein capacitor electrodes form two capacitors cross-coupled between gates of drive transistors.

The conventional example 2 discloses an SRAM wherein a flip-flop circuit is formed by cross-connecting mutual input/output terminals (storage nodes) of a pair of CMOS inverters via a pair of local interconnections, with capacitance being formed between each local interconnection and a reference voltage line.

In Japanese Patent Laying-Open No. 2002-076143 (conventional example 3), an SRAM is disclosed wherein local interconnections have their surfaces roughened to ensure large capacitance of the capacitor formed between local interconnections.

The above-described SRAM, however, suffer the following problem.

When capacitance is being added by the capacitor as described above, if the capacitor is increased in size to secure certain capacitance, the cell size will increase. That is, in order to improve the soft-error tolerance, a structure that will not place an obstacle to reduction of the cell area needs to be employed.

Any of the conventional SRAM memory cells as described above do not have a structure suitable for a lateral type cell in which three partitioned wells are arranged side by side in the direction along which a word line extends.

SUMMARY OF THE INVENTION

An object of the present invention is to provide an SRAM as a semiconductor memory device for which an increase of the cell area is restricted and which exhibits high soft error tolerance.

A semiconductor memory device according to the present invention includes a word line, a bit line extending in a direction orthogonal to an extending direction of the word line, and a memory cell longer in the extending direction of the word line than in an extending direction of the bit line. The memory cell includes a first well region of a first conductivity type, a second well region of a second conductivity type and a third well region of the first conductivity type arranged side by side in the extending direction of the word line, a first driver MOS transistor and a first access MOS transistor formed on the first well region, first and second load MOS transistors formed on the second well region, a second driver MOS transistor and a second access MOS transistor formed on the third well region, a first local interconnection formed in an interlayer insulating film covering the first and second driver MOS transistors, the first and second access MOS transistors and the first and second load MOS transistors and connecting active regions of the first driver MOS transistor, the first access MOS transistor and the first load MOS transistor with gate electrodes of the second driver MOS transistor and the second load MOS transistor, a second local interconnection formed in the interlayer insulating film and connecting active regions of the second driver MOS transistor, the second access MOS transistor and the second load MOS transistor with gate electrodes of the first driver MOS transistor and the first load MOS transistor, first and second lower plates formed spaced apart from each other on the interlayer insulating film, and first and second upper plates formed on the first and second lower plates, respectively, with dielectric films interposed therebetween, and forming first and second capacitors together with the first and second lower plates, respectively. The second upper plate and the first lower plate, and the first upper plate and the second lower plate are connected via first and second contact holes formed in the respective dielectric films. The first and second contact holes are formed on the first and second local interconnections, respectively.

According to the present invention, a pair of capacitors cross-coupled to each other are connected to the storage nodes in a lateral type cell (memory cell having three partitioned cells arranged side by side in the extending direction of a word line and longer in the word line direction than in the bit line direction). As such, it is possible to improve the soft-error tolerance of the SRAM (semiconductor memory device), while guaranteeing certain capacitance in the capacitors and suppressing an increase of the cell area.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the semiconductor memory devices according to the present invention will be described with reference to FIGS. 1-31.

In an SRAM operating with low voltage and using a fine design rule after the 0.18 µm rule, it is desirable to take countermeasures against soft errors even in the case of a full CMOS SRAM.

Here, the soft error is a phenomenon where data having been held is inverted for some reasons, as described above. More specifically, it is the phenomenon where information is destroyed, for example, by a noise due to an electron-hole pair generated when an α ray emitted from U or Th included in a package passes through a silicon substrate, causing malfunction of the memory.

Figure 31:
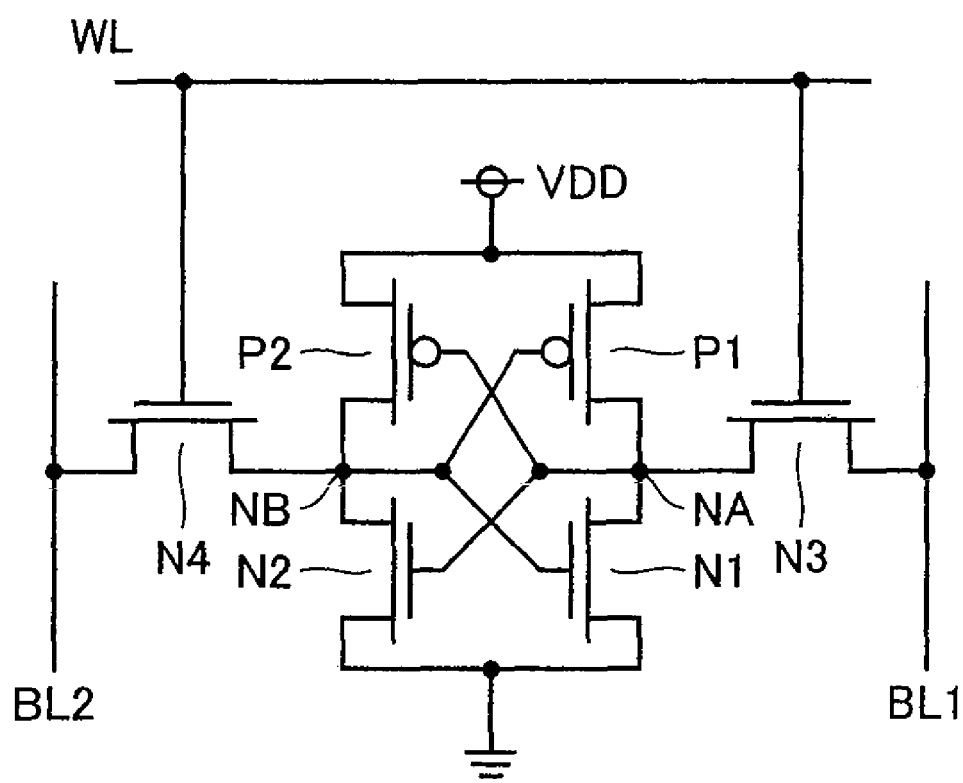
FIG. 31 is an equivalent circuit diagram of a common full CMOS cell (SRAM memory cell).

FIG. 31 shows by way of example an equivalent circuit diagram of a common full CMOS cell. Hereinafter, the soft error is explained with reference to FIG. 31.

As an example of a general data holding state, for example, the state where a storage node NA is held at an L (Low) level and a storage node NB is held at an H (High) level is considered. In this state, a first driver MOS transistor N1 and a second load MOS transistor P2 are on, while a second driver MOS transistor N2 and a first load MOS transistor P1 are off. As a result, storage nodes NA and NB are connected to a GND line (ground line) and a VDD line (power supply line), respectively.

When excessive charges are introduced to storage node NB, driving it to the VDD level by second load MOS transistor P2 is insufficient, so that storage node NB shifts to an L level. As a result, first driver MOS transistor N1 shifts from the on state to an off state, and first load MOS transistor P1 shifts from the off state to an on state, and thus, the potential of storage node NA is driven to a VDD level.

As the potential of storage node NA is driven to the VDD level, second driver MOS transistor N2 shifts from the off state to an on state, and second load MOS transistor P2 shifts from the on state to an off state. As a result, the potential of storage node NB becomes a GND level.

Through the above-described steps, storage nodes NA and NB are held at an H level and an L level, respectively. That is to say, the memory cell maintains wrong data having a state opposite to the initial state.

A conceivable way to address such a situation as described above will be to connect a capacitor to the storage node to add capacitance to alleviate the steep potential change, to thereby improve the soft-error tolerance.

First Embodiment

A memory cell 1 of a full CMOS SRAM as a semiconductor memory device according to a first embodiment of the present invention is now described with reference to FIGS. 1-6.

The SRAM according to the present embodiment includes a memory cell region where memory cell 1 shown in FIGS. 1-5 is formed, and a peripheral circuit region where a peripheral circuit controlling operations of memory cell 1 is formed.

Figure 4:
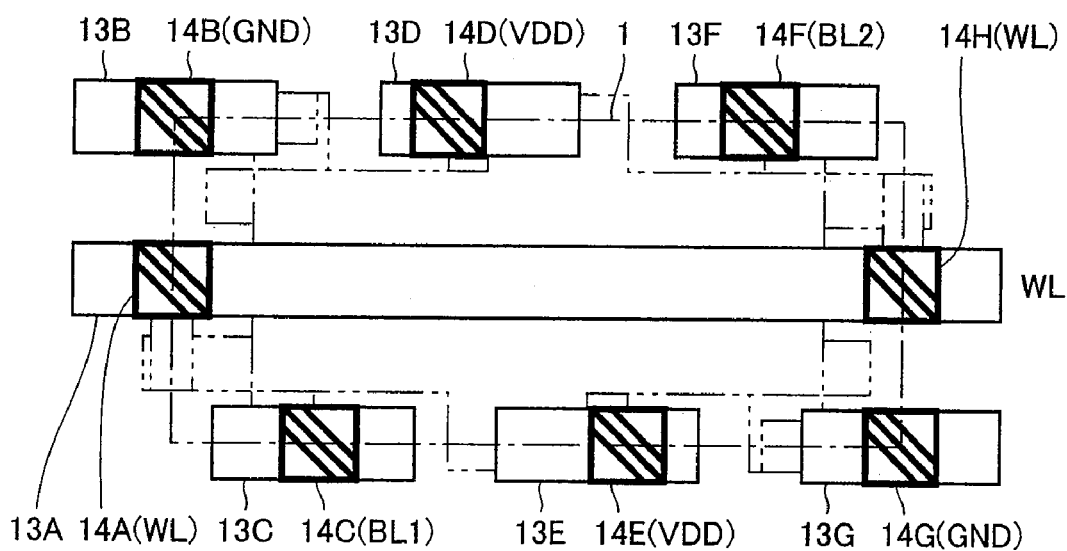
FIGS. 4 and 5 are layout diagrams of upper layer metal interconnections of the SRAM memory cell of the first embodiment, showing layout configurations of first and second metal interconnection layers, respectively.
Figure 5:
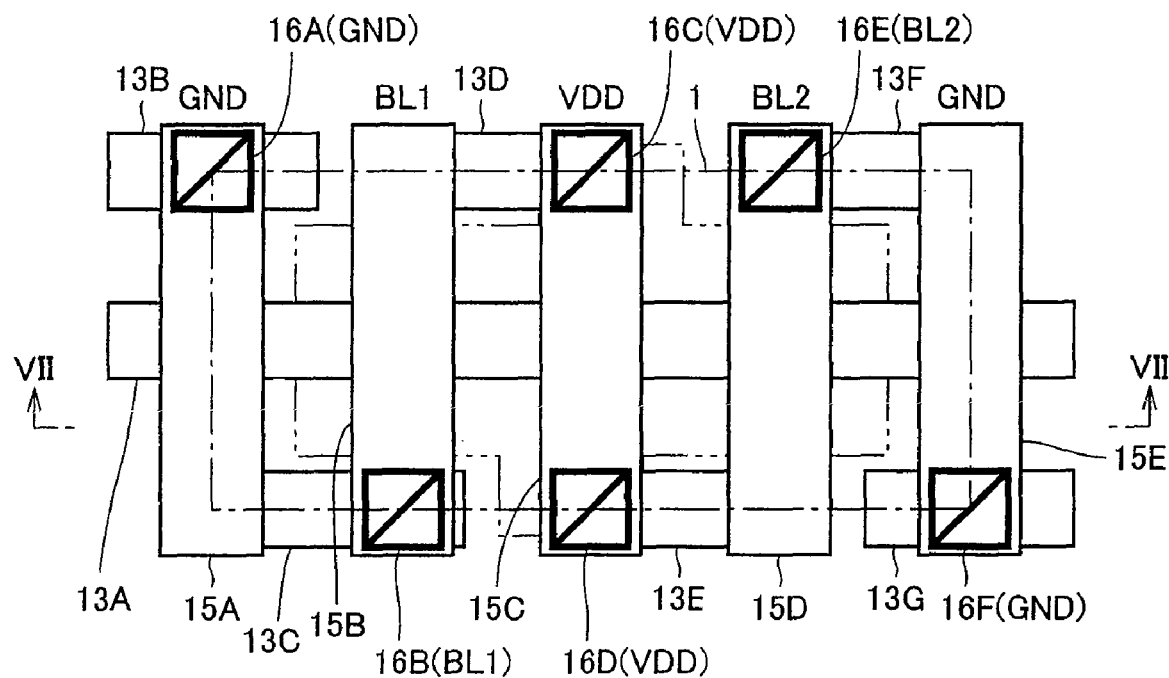
Figure 6:
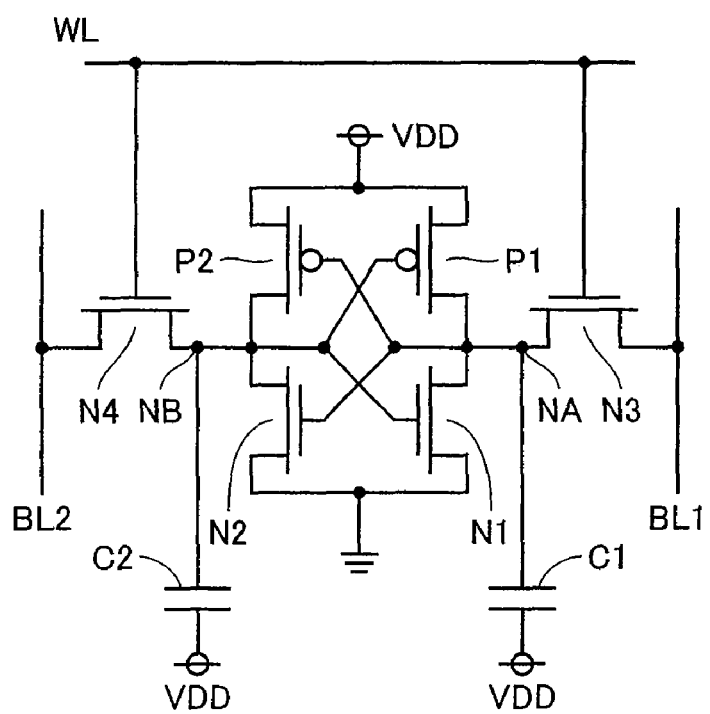
FIG. 6 is an equivalent circuit diagram of the SRAM memory cell of the first embodiment.

FIG. 6 is an equivalent circuit diagram of memory cell 1 shown in FIGS. 1-5.

A configuration of memory cell 1 of the SRAM is now described with reference to FIG. 6. Memory cell 1 has a full CMOS cell structure, and includes first and second inverters, and two access NMOS transistors N3, N4.

As shown in FIG. 6, the first inverter includes a first driver MOS transistor N1 and a first load MOS transistor P1. The second inverter includes a second driver MOS transistor N2 and a second load MOS transistor P2.

The first and second inverters having their inputs and outputs cross-coupled to each other constitute a flip-flop. The flip-flop has a first storage node NA to which a source/drain (active region) of a first access MOS transistor N3 is connected, and a second storage node NB to which a source/drain (active region) of a second access MOS transistor N4 is connected.

Storage node NA is connected to a bit line BL1 via first access MOS transistor N3, and storage node NB is connected to a bit line BL2 via second access MOS transistor N4. The gate electrodes of first and second access MOS transistors N3, N4 are connected to a word line WL, the sources of first and second load MOS transistors P1, P2 are connected to a power supply line VDD, and the sources of first and second driver MOS transistors N1, N2 are connected to a ground line.

Capacitors C1, C2 formed within memory cell 1 are added to storage nodes NA, NB, respectively, and are connected to a VDD line (power supply line). Adding capacitors C1, C2 can alleviate a steep potential change, and improve soft-error tolerance.

Hereinafter, the layout of memory cell 1 of the full CMOS SRAM according to the present embodiment will be described.

Figure 1:
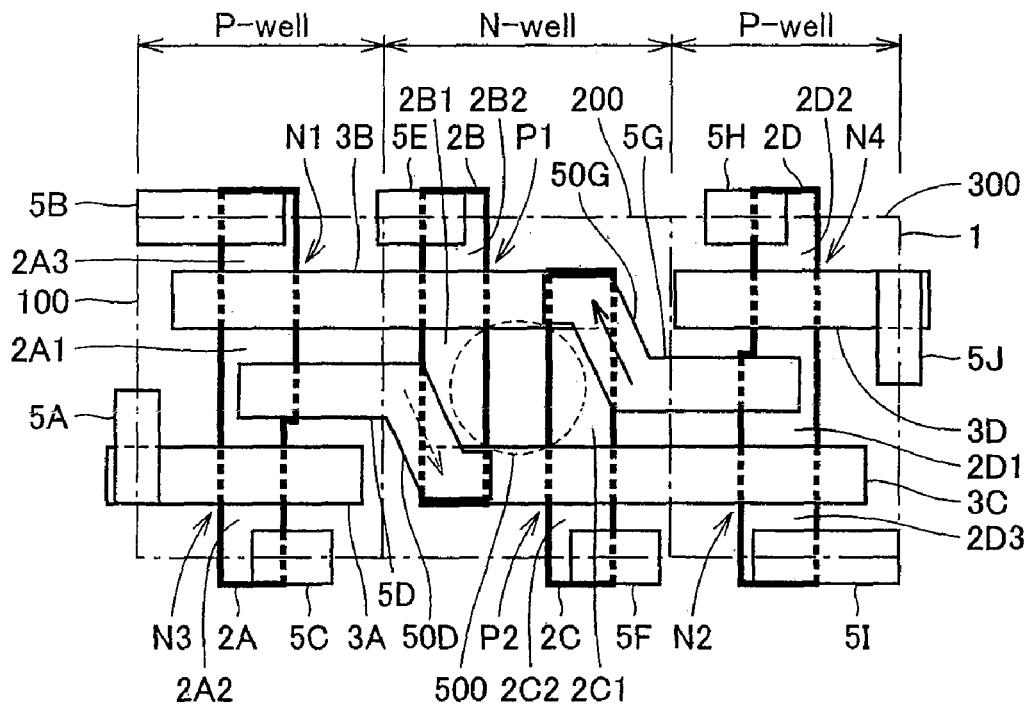
FIG. 1 shows a layout configuration of an SRAM memory cell according to a first embodiment of the present invention.
Figure 2:
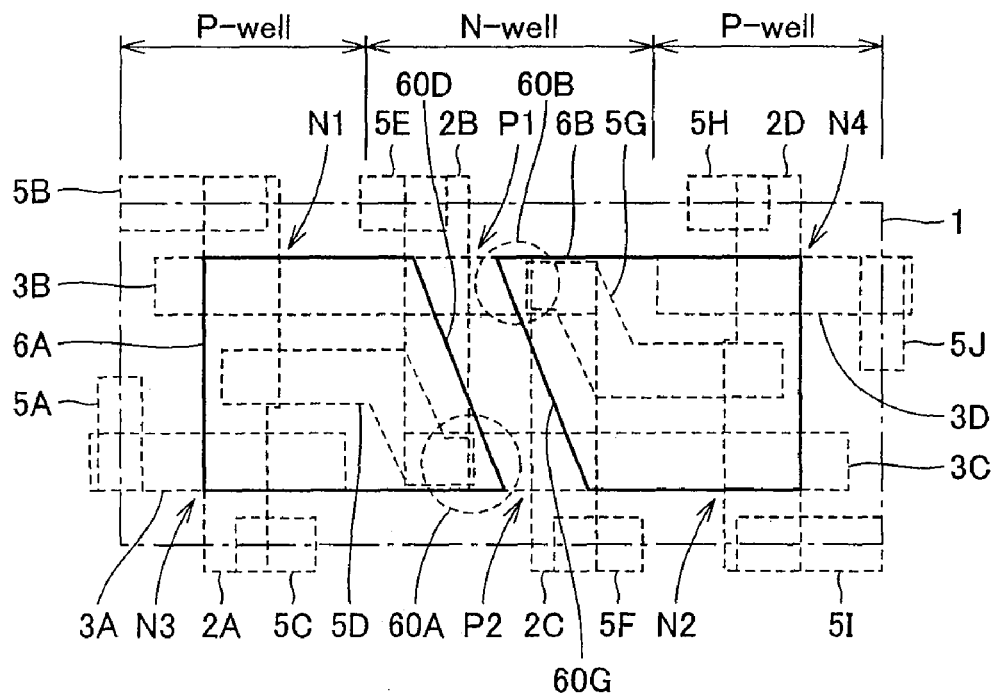
FIG. 2 shows a layout configuration of a lower cell plate of a capacitor formed in the SRAM memory cell according to the first embodiment.
Figure 3:
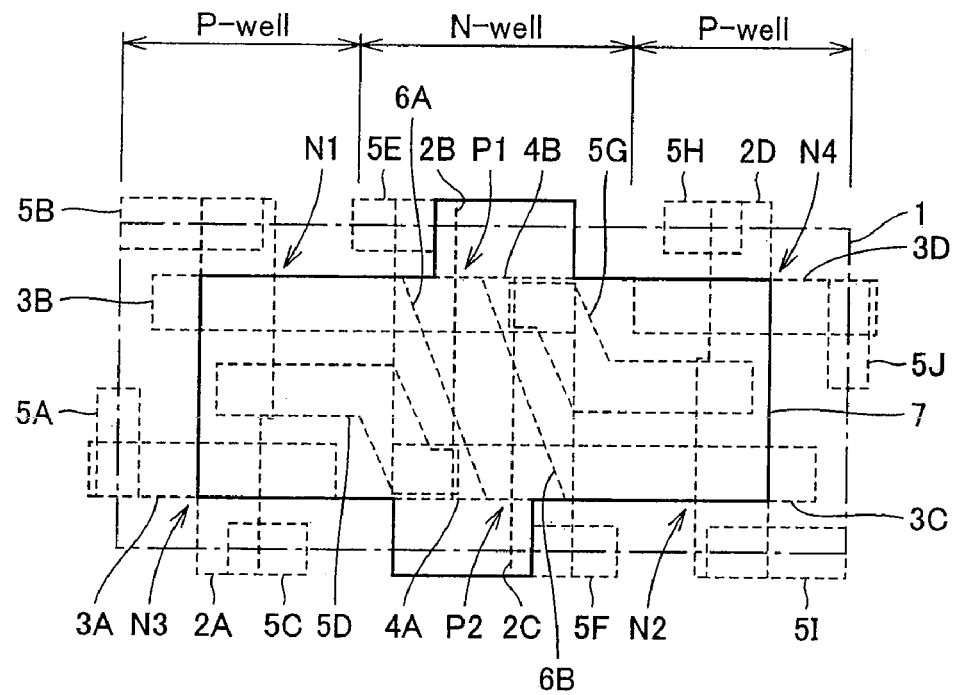
FIG. 3 shows a layout configuration of an upper cell plate of the capacitor formed in the SRAM memory cell according to the first embodiment.

FIG. 1 shows the layout up to embedded interconnections including the storage nodes formed in an interlayer insulating film. FIG. 2 shows the layout of lower cell plates formed on the embedded interconnections. FIG. 3 shows the layout of an upper cell plate formed on the lower cell plates via a dielectric film.

The word lines of the SRAM extend in a lateral direction, as shown in FIG. 4 that will be explained later, and the bit lines of the SRAM extend in a direction orthogonal to the word lines, as shown in FIG. 5 that will be explained later. Here, memory cell 1 is longer in the word line extending direction than in the bit line extending direction. In FIGS. 1-3, a P-well region 100 (first well region) of P type (first conductivity type), an N-well region 200 (second well region) of N type (second conductivity type), and a P-well region 300 of P type (first conductivity type) are provided side by side in the word line extending direction (lateral direction).

The first well region has first driver MOS transistor N1 and first access MOS transistor N3 formed therein. The second well region has first and second load MOS transistors P1, P2 formed therein. The third well region has second driver MOS transistor N2 and second access MOS transistor N4 formed therein.

P-well regions 100, 300 have active regions 2A, 2D, respectively, in which N type impurities such as phosphorus are selectively introduced. N-well region 200 has active regions 2B, 2C in which P type impurities such as boron are selectively introduced. Herein, active regions 2A-2D refer to regions that include regions to be sources/drains of the transistors, and a region located between the neighboring source/drain regions to form a channel of a conductivity type opposite to that of the source/drain regions (substrate portion).

In FIG. 1, active regions 2A-2D are formed in the regions delimited by bold lines, and element isolating regions are formed outside the regions delimited by the bold lines.

Active regions 2A, 2D and active regions 2B, 2C all have an approximately straight shape and extend in the same direction (corresponding to the extending direction of the P- and N-well regions).

First access MOS transistor N3 is formed of active region 2A (2A1, 2A2) including the regions to be source/drain, and a polycrystalline silicon (polysilicon) interconnection 3A. Second access MOS transistor N4 is formed of active region 2D (2D1, 2D2) including the regions to be source/drain, and a polysilicon interconnection 3D.

First driver MOS transistor N1 is formed of active region 2A (2A1, 2A3) including the regions to be source/drain, and a polysilicon interconnection 3B. Second driver MOS transistor N2 is formed of active region 2D (2D1, 2D3) including the regions to be source/drain, and a polysilicon interconnection 3C.

First load MOS transistor P1 is formed of active region 2B (2B1, 2B2) including the regions to be source/drain, and polysilicon interconnection 3B. Second load MOS transistor P2 is formed of active region 2C (2C1, 2C2) including the regions to be source/drain, and polysilicon interconnection 3C.

Polysilicon interconnections 3A-3D extend in the same direction, as shown in FIG. 1. That is, polysilicon interconnections 3A-3D extend in the word line extending direction (lateral direction in FIG. 1), along which the P- and N-well regions are arranged side by side.

Embedded interconnections 5A-5J shown in FIG. 1 are now described. An interlayer insulating film (not shown) is formed to cover active regions 2A-2D and polysilicon interconnections 3A-3D. Formed in the interlayer insulating film are contact portions reaching active regions 2A-2D and polysilicon interconnections 3A-3D. The contact portions are embedded with a conductive layer such as copper to form damascene interconnections, which become embedded interconnections 5A-5J. In other words, embedded interconnections 5A-5J are formed in the interlayer insulating film covering the above-described MOS transistors N1-N4, P1 and P2.

Of the connections through the contact portions, connections between interconnections 5A, 5J and polysilicon interconnections 3A, 3D, respectively, constitute gate contacts connected to the gate electrodes. Connections between interconnections 5D, 5G and active regions 2B, 2C and polysilicon interconnections 3C, 3B, respectively, constitute shared contacts connected to the gate electrodes and the active regions. Connections between interconnections 5B-5D and active region 2A, between interconnection 5E and active region 2B, between interconnection 5F and active region 2C, and between interconnections 5G-5I and active region 2D constitute diffusion contacts connected to the active regions.

In FIG. 1, the N type active region 2A1 corresponds to the drain of first driver MOS transistor N1 and the source/drain of first access MOS transistor N3. The drains of first driver MOS transistor N1, first access MOS transistor N3 and first load MOS transistor P1 are connected to the gate electrodes of second driver MOS transistor N2 and second load MOS transistor P2 via embedded interconnection 5D. This terminal (embedded interconnection 5D) corresponds to storage node NA (first local interconnection) in the equivalent circuit diagram shown in FIG. 6.

Similarly, the N type active region 2D1, corresponding to the drain of second driver MOS transistor N2 and the source/drain of second access MOS transistor N4, is connected to the drain of second load MOS transistor P2 as well as to the gate electrodes of first driver MOS transistor N1 and first load MOS transistor P1 via embedded interconnection 5G. This terminal (embedded interconnection 5G) corresponds to storage node NB (second local interconnection) in the equivalent circuit diagram of FIG. 6.

In short, storage nodes NA, NB can be described as follows. Embedded interconnection 5D (first local interconnection) to be the first storage node connects the sources/drains of first driver MOS transistor N1, first access MOS transistor N3 and first load MOS transistor P1 with the gate electrodes of second driver MOS transistor N2 and second load MOS transistor P2. Embedded interconnection 5G (second local interconnection) to be the second storage node connects the sources/drains of second driver MOS transistor N2, second access MOS transistor N4 and second load MOS transistor P2 with the gate electrodes of first driver MOS transistor N1 and first load MOS transistor P1.

In FIG. 1, interconnections 5A, 5J are connected to the word line (WL) shown in FIG. 4, and interconnections 5B, 5I are connected to the ground lines (GND lines) shown in FIG. 5. Interconnections 5C, 5H are connected to bit lines BL1, BL2, respectively, shown in FIG. 5, and interconnections 5E, 5F are connected to the power supply line (VDD line) shown in FIG. 5. The word line, GND lines, bit lines and VDD line are formed above the embedded interconnections, with an interlayer insulating film interposed therebetween.

As a result, parts of active regions 2A, 2D within P-well regions 100, 300 become the source terminals of driver MOS transistors N1, N2, respectively, to which a GND potential is provided.

Further, parts of active regions 2A, 2D within P-well regions 100, 300 become the source terminals of access MOS transistors N3, N4, respectively, which are connected to bit lines BL1, BL2, respectively.

Still further, parts of active regions 2B, 2C within N-well region 200 become the source terminals of load MOS transistors P1, P2, respectively, which are each connected to a power supply line (VDD line).

Polysilicon interconnections 3A, 3D are electrically connected to a word line via embedded interconnections 5A, 5J.

As shown in FIG. 1, embedded interconnection 5G (second local interconnection) is electrically connected to polysilicon interconnection 3B (first conductive layer, another conductive layer) to be the gate electrodes of first driver MOS transistor N1 and first load MOS transistor P1, and has a slanting portion 50G that extends in a direction (shown by a solid arrow in FIG. 1) crossing the longitudinal direction of polysilicon interconnection 3B at an obtuse angle when seen from above the interlayer insulating film in which interconnection 5G is embedded. Embedded interconnection 5D (first local interconnection) is electrically connected to polysilicon interconnection 3C (second conductive layer, a conductive layer) to be the gate electrodes of second driver MOS transistor N2 and second load MOS transistor P2, and has a slanting portion 50D that extends in a direction (shown by a dotted arrow in FIG. 1) crossing the longitudinal direction of polysilicon interconnection 3C at an obtuse angle when seen from above the interlayer insulating film in which interconnection 5D is embedded. Slanting portions 50D and 50G extend approximately in parallel with each other.

Referring to FIG. 2, lower cell plates 6 (6A, 6B) made of a conductive material are formed spaced apart from each other above the interlayer insulating film to cover embedded interconnections 5D, 5G.

Lower cell plate 6A has a protrusion 60A (first protrusion) protruding toward lower cell plate 6B. Lower cell plate 6B has a protrusion 60B (second protrusion) protruding toward lower cell plate 6A.

In the plane shown in FIG. 2, protrusion 60A of lower cell plate 6A has a tapered shape that narrows in width as it approaches lower cell plate 6B, and protrusion 60B of lower cell plate 6B has a tapered shape that narrows as it approaches lower cell plate 6A. Lower cell plates 6A, 6B are formed to cover embedded interconnections 5D, 5G (first and second local interconnections), respectively, and have slanting edges 60D, 60G extending along slanting portions 50D, 50G, respectively.

Lower cell plates 6A, 6B may have structures not completely covering embedded interconnections 5D, 5G, as long as electrical connections between lower cell plates 6A, 6B and embedded interconnections 5D, 5G are secured.

It is necessary to have a certain space between embedded interconnections 5D and 5G, for the purpose of preventing a short-circuit therebetween.

In this regard, in the memory cell 1 described above, parts of embedded interconnections 5D, 5G are made to extend obliquely with respect to active regions 2 (2B, 2C) and polysilicon interconnections 3 (3B, 3C). This can increase the size of a margin region 500 formed between embedded interconnections 5D and 5G, compared to the case where interconnections 5D, 5G extend on and along active regions 2B, 2C. Thus, a process margin at the time of formation of embedded interconnections 5D, 5G can be guaranteed, and as a result, the space between active regions 2B and 2C, and hence, the area of memory cell 1 can be reduced.

On the other hand, lower cell plates 6A, 6B are connected to embedded interconnections 5D, 5G, respectively, with the plates 6A, 6B electrically insulated from each other. Adopting lower cell plates 6A, 6B having the above-described tapered shape can efficiently increase the areas of lower cell plates 6A, 6B in a memory cell of the same area, while covering embedded interconnections 5D, 5G.

Referring to FIG. 3, upper cell plate 7 of a conductive material is formed above lower cell plates 6A, 6B, with a dielectric film interposed therebetween. Upper cell plate 7 is formed to cover lower cell plates 6A, 6B.

With the configuration as described above, capacitor C1 (first capacitor) is formed by lower cell plate 6A and upper cell plate 7, and capacitor C2 (second capacitor) is formed by lower cell plate 6B and upper cell plate 7. Here, providing lower cell plates 6 (6A, 6B) can increase the capacitance of the capacitors added to embedded interconnections 5 (5D, 5G) without increasing the memory cell area. Further, lower cell plates 6A, 6B in direct contact with embedded interconnections 5D, 5G, respectively, can increase the contact area and ensure the connection than in the case where they are connected indirectly via contact portions formed in another interlayer insulating film.

Hereinafter, metal interconnections formed above lower and upper cell plates 6, 7 will be described.

FIGS. 4 and 5 show the layout of upper metal interconnections formed on the upper cell plate. FIG. 4 shows arrangement of first layer metal interconnections 13A-13G including word line WL. FIG. 5 shows arrangement of second layer metal interconnections 15A-15E including bit lines BL1, BL2, the power supply line (VDD line) and the ground lines (GND lines), formed on the first layer metal interconnections with an interlayer insulating film (not shown) interposed therebetween.

Referring to FIG. 4, interconnection 13A to be a word line is connected to embedded interconnection 5A through a via hole 14A, and connected to embedded interconnection 5J through a via hole 14H. Interconnections 13B, 13G are connected to embedded interconnections 5B, 5I through via holes 14B, 14G, respectively. Interconnections 13C, 13F are connected to embedded interconnections 5C, 5H through via holes 14C, 14F, respectively. Interconnections 13D, 13E are connected to embedded interconnections 5E, 5F through via holes 14D, 14E, respectively.

Referring to FIG. 5, interconnections 13B, 13G are connected to interconnections 15A, 15E to be GND lines, through via holes 16A, 16F, respectively. Interconnections 13C, 13F are connected to interconnections 15B, 15D to be bit lines BL1, BL2, respectively, through via holes 16B, 16E, respectively. Interconnections 13D, 13E are connected to interconnection 15C to be a VDD line through via holes 16C, 16D, respectively.

Figure 7:
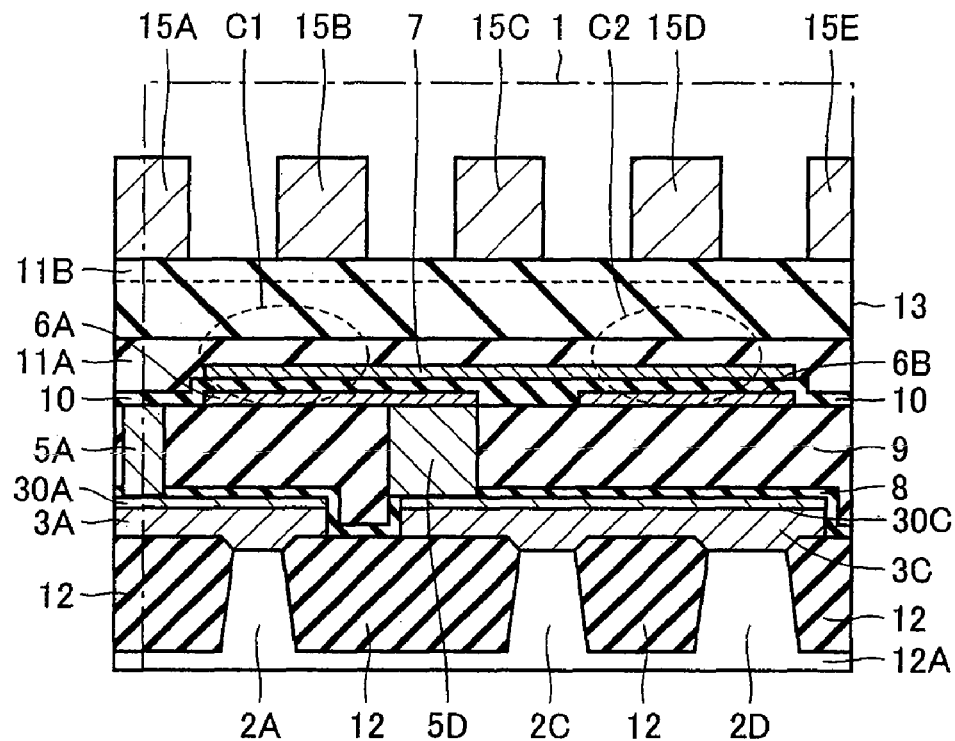
FIG. 7 is a cross sectional view taken along the line VII-VII in FIG. 5.

FIG. 7 is a cross sectional view taken along the line VII-VII in FIG. 5. In FIG. 7, active region 2B located beneath embedded interconnection 5D is not shown for clarity of drawing and explanation.

Referring to FIG. 7, lower cell plates 6A, 6B extend on embedded interconnections 5D, 5G, respectively, in direct contact therewith. Lower cell plates 6A, 6B and upper cell plate 7 sandwich a dielectric film 10 therebetween. As dielectric film 10, for example, a silicon oxide film, which is normally used for an interlayer insulating film, may be used. More preferable materials will be silicon nitride oxide film, silicon nitride film and others having higher relative dielectric constants.

With the configurations described above, according to the present embodiment, in a lateral type cell longer in the word line extending direction than in the bit line extending direction, the areas on the driver MOS transistors, access MOS transistors and load MOS transistors can efficiently be used to form capacitors added to the storage nodes for improving soft-error tolerance. Accordingly, it is possible to improve the soft-error tolerance while suppressing the increase in area of memory cell 1.

Second Embodiment

Figure 10:
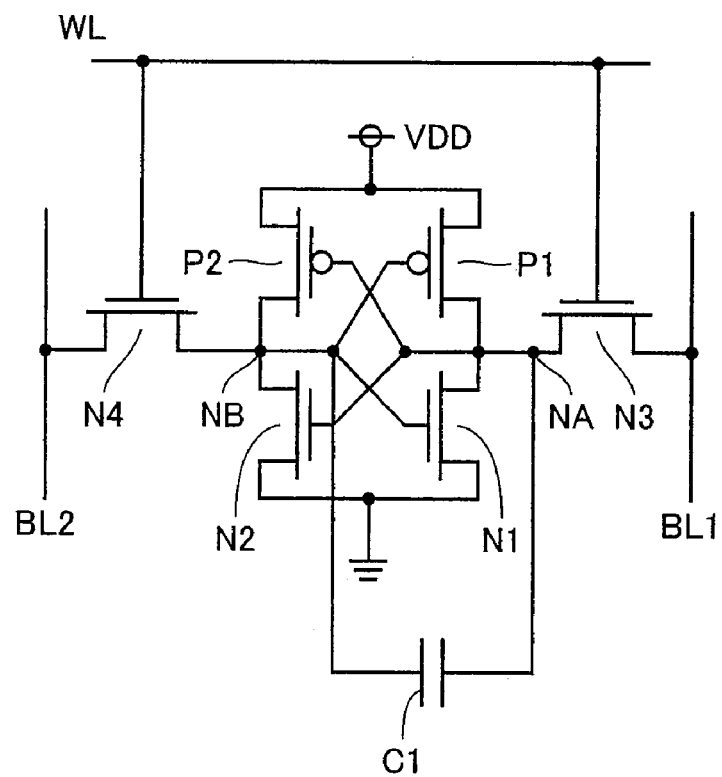
FIG. 10 is an equivalent circuit diagram of the SRAM memory cell of the second embodiment.

FIG. 10 is an equivalent circuit diagram of a memory cell 1 of a full CMOS SRAM as a semiconductor memory device according to a second embodiment of the present invention.

Referring to FIG. 10, the SRAM of the present embodiment is a modification of the SRAM of the first embodiment, which differs from the first embodiment in that both storage nodes NA and NB are connected to one capacitor C1.

Figure 8:
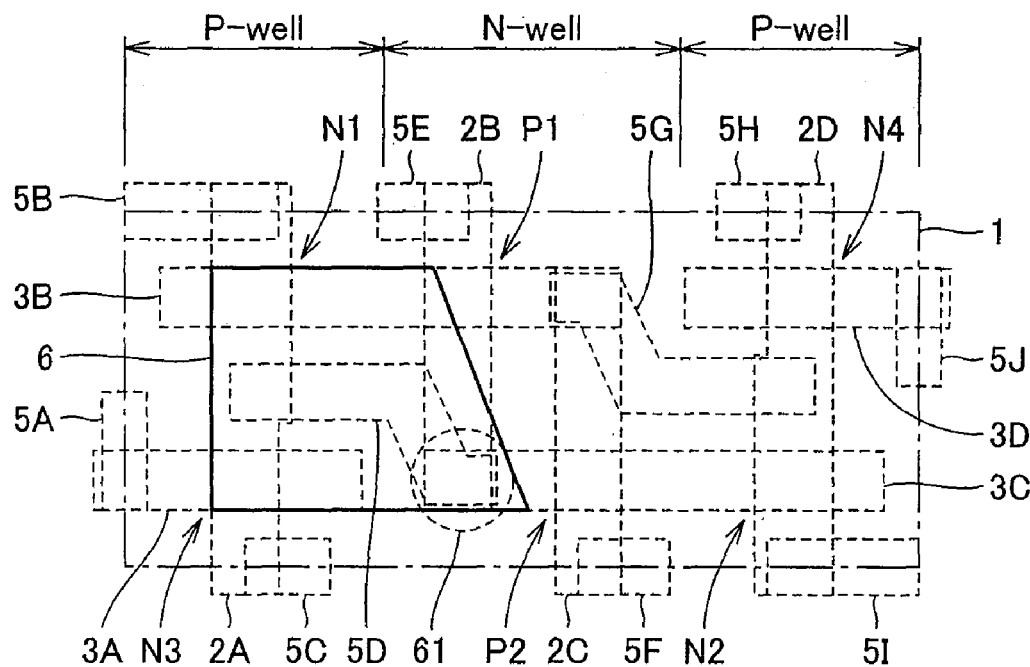
FIG. 8 shows a layout configuration of a lower cell plate of a capacitor formed in an SRAM memory cell according to a second embodiment of the present invention.
Figure 9:
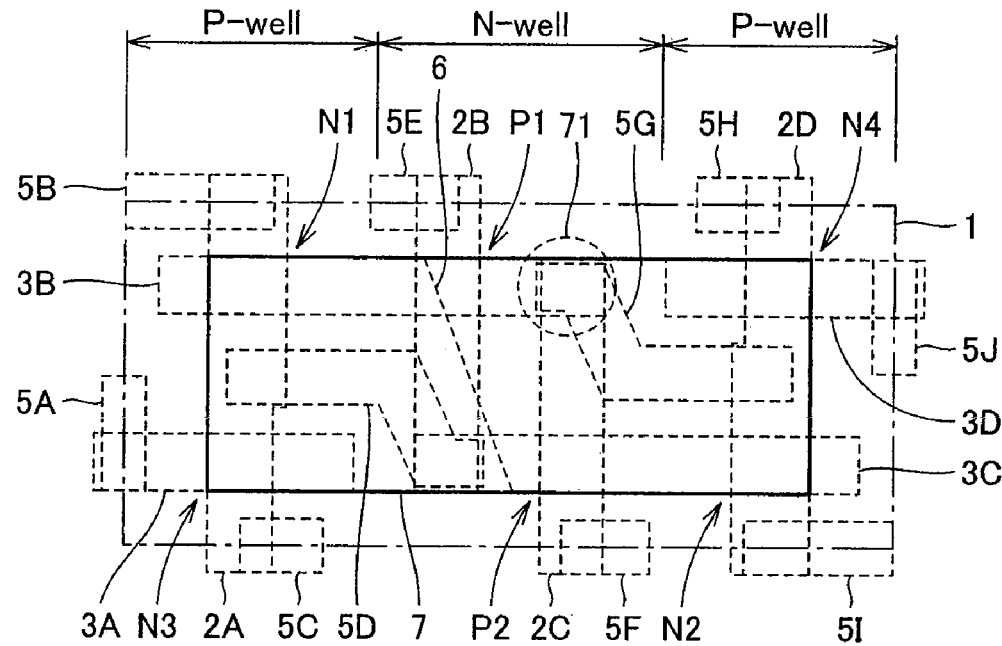
FIG. 9 shows a layout configuration of an upper cell plate of the capacitor formed in the SRAM memory cell according to the second embodiment.

FIGS. 8 and 9 are top plan views of memory cell 1 of the full CMOS SRAM. FIG. 8 shows the layout of the lower cell plate of capacitor C1 formed on the embedded interconnections. FIG. 9 shows the layout of the upper cell plate of capacitor C1 formed on the lower cell plate with a dielectric film interposed therebetween. The layout up to the embedded interconnections including storage nodes NA, NB formed in the interlayer insulating film, is identical to that of the first embodiment (FIG. 1).

Referring to FIG. 8, lower cell plate 6 of capacitor C1, which is made of a conductive material, is formed on the interlayer insulating film having embedded interconnection 5D. Lower cell plate 6 is formed to cover embedded interconnection 5D (first local interconnection). Lower cell plate 6 and embedded interconnection 5D are connected at a contact portion 61.

Referring to FIG. 9, upper cell plate 7 of capacitor C1, which is made of a conductive material, is formed above lower cell plate 6. Upper cell plate 7 and embedded interconnection 5G are connected at a contact portion 71. With this configuration, capacitor C1 is formed by lower and upper cell plates 6 and 7.

As shown in FIG. 10, since capacitor C1 is provided between storage nodes NA and NB, even if a potential of one storage node decreases, the potential of the other storage node decreases correspondingly, which is considered to improve the soft-error tolerance.

In the present embodiment, detailed description of the matters similar to those of the first embodiment is not repeated.

Third Embodiment

Figure 14:
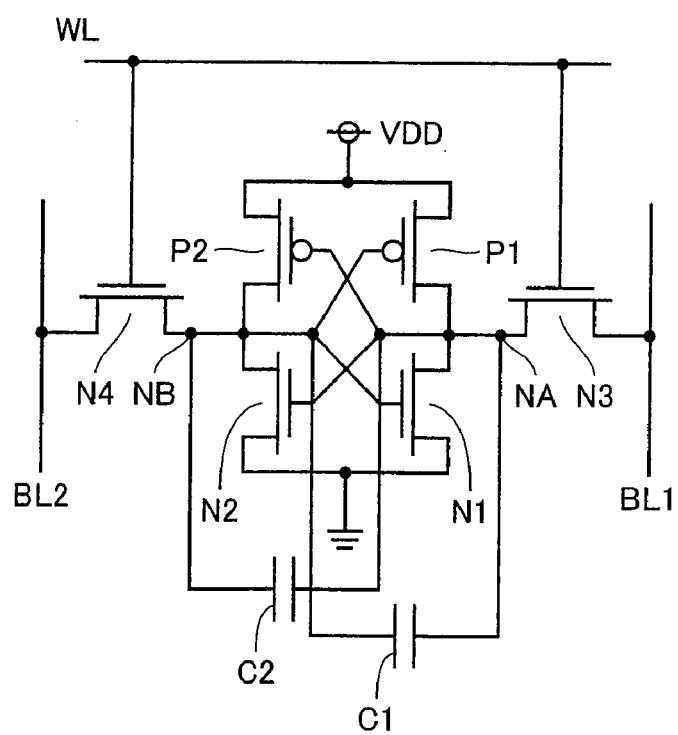
FIG. 14 is an equivalent circuit diagram of the SRAM memory cell of the third embodiment.

FIG. 14 is an equivalent circuit diagram of a memory cell 1 of a full CMOS SRAM as a semiconductor memory device according to a third embodiment of the present invention.

Referring to FIG. 14, the SRAM of the present embodiment is a modification of the SRAM of the first embodiment, and differs from the first embodiment in that both storage nodes NA and NB are connected to two capacitors C1 and C2 (first and second capacitors).

Figure 11:
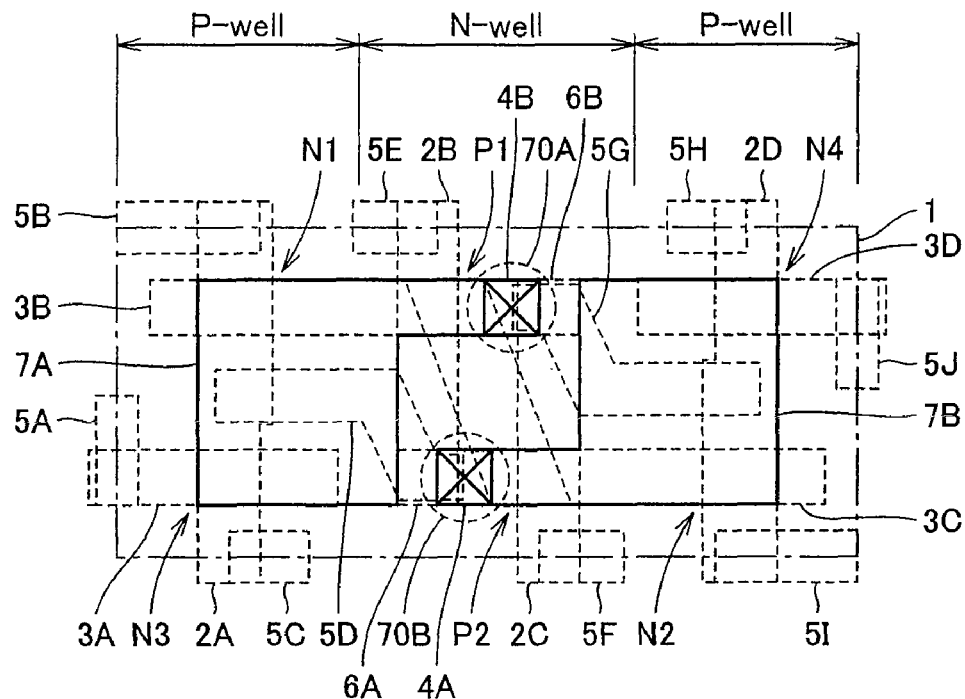
FIG. 11 shows a layout configuration of an upper cell plate of a capacitor formed in an SRAM memory cell according to a third embodiment of the present invention.

FIG. 11 is a top plan view of memory cell 1 of the full CMOS SRAM, showing the layout of the upper cell plates of capacitors C1, C2 formed on the lower cell plates with a dielectric film interposed therebetween.

The layout up to the embedded interconnection layer including the storage nodes formed in the interlayer insulating film, and the shapes of lower cell plates 6A, 6B formed on the embedded interconnection layer are identical to those of the first embodiment (FIGS. 1 and 2).

Referring to FIG. 11, upper cell plates 7A, 7B (first and second upper plates) are formed spaced apart from each other.

As a result, capacitor C1 (first capacitor) is formed by lower and upper cell plates 6A and 7A, and capacitor C2 (second capacitor) is formed by lower and upper cell plates 6B and 7B.

Here, cell plates 6A and 7B, and cell plates 6B and 7A, are cross-coupled to each other via contact holes 4A, 4B (first and second contact holes) formed in the respective dielectric films between cell plates 6 (6A, 6B) and 7 (7A, 7B).

As a result of such cross coupling, storage nodes NA, NB are each connected to two capacitors C1 and C2. Further, capacitors C1, C2 are coupled between the inputs and the outputs of the inverters, and thus, the capacitance of capacitors C1, C2 increases (up to about two times) by virtue of the Miller effect.

The shapes of lower and upper cell plates 6, 7 in the present embodiment are described in brief as follows. Lower cell plate 6A has a protrusion 60A (first protrusion) protruding toward lower cell plate 6B, and lower cell plate 6B has a protrusion 60B (second protrusion) protruding toward lower cell plate 6A. Upper cell plate 7A has a protrusion 70A (third protrusion) protruding toward upper cell plate 7B to overlap protrusion 60B, and upper cell plate 7B has a protrusion 70B (fourth protrusion) protruding toward upper cell plate 7A to overlap protrusion 60A. Protrusions 60A and 70B are electrically connected via contact hole 4A (first contact hole), and protrusions 60B and 70A are electrically connected via contact hole 4B (second contact hole).

Contact holes 4A, 4B for connecting lower and upper cell plates 6, 7 are formed on embedded interconnections 5D, 5G (first and second local interconnections), respectively.

Figure 12:
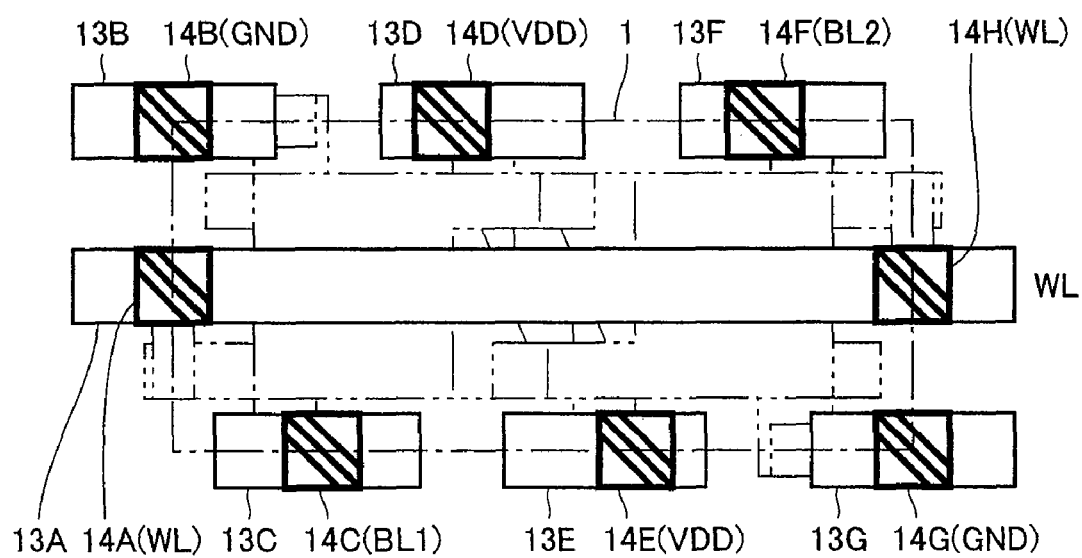
FIGS. 12 and 13 are layout diagrams showing upper layer metal interconnections of the SRAM memory cell of the third embodiment, showing layout configurations of first and second metal interconnection layers, respectively.
Figure 13:
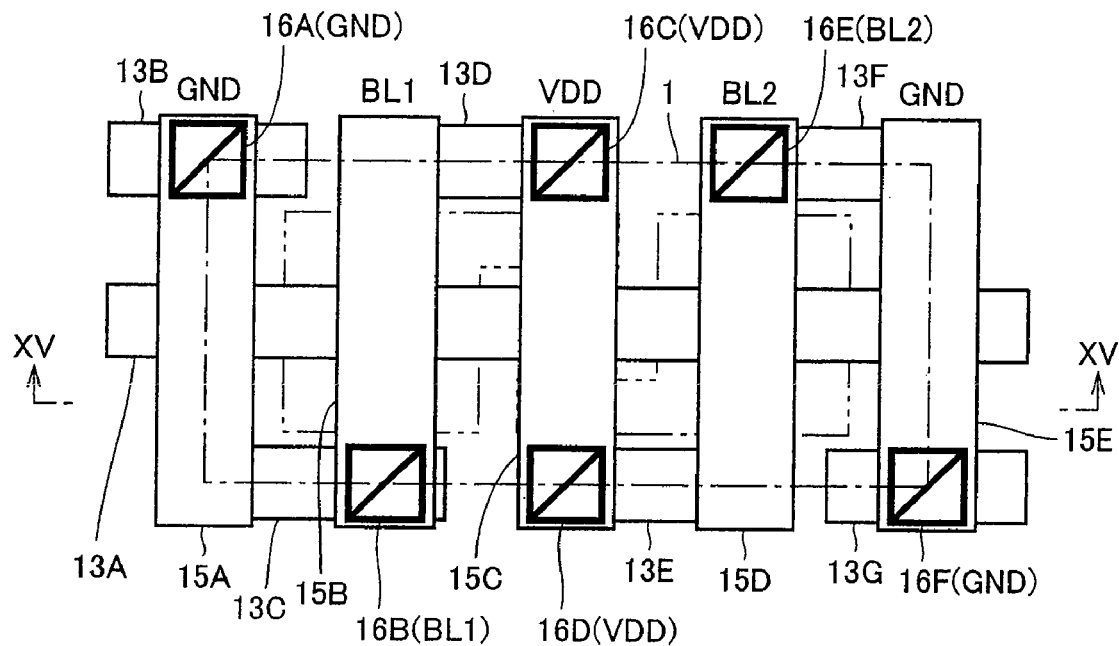

FIGS. 12 and 13 show an example of the layout of upper layer interconnections formed on interlayer insulating film 11.

Referring to FIGS. 12 and 13, the upper layer metal interconnections are arranged in the same manner as in the first embodiment.

Figure 15:
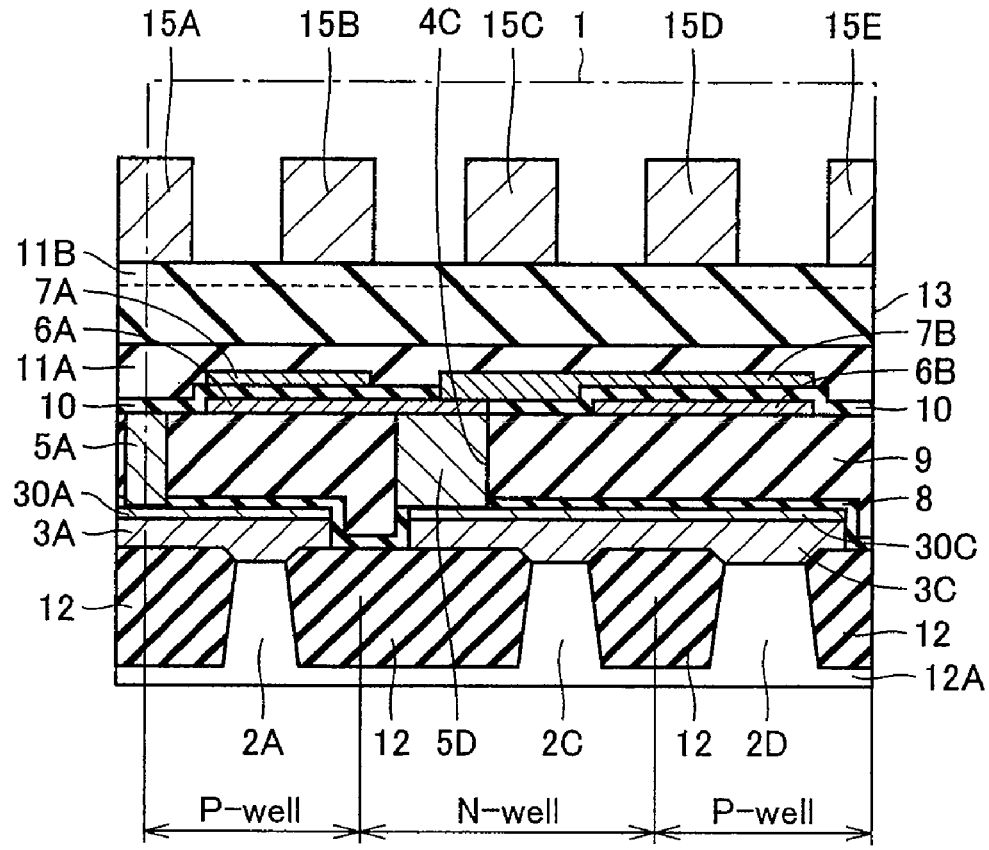
FIG. 15 is a cross sectional view taken along the line XV-XV in FIG. 13.

FIG. 15 shows a cross sectional structure of memory cell 1 having the above-described structure. FIG. 15 is a cross sectional view of memory cell 1 taken along the line XV-XV in FIG. 13. In FIGS. 15 and 16-22 that will be explained later, active region 2B located beneath embedded interconnection 5D is not shown for clarity of drawing and explanation.

Referring to FIG. 15, in the SRAM according to the present embodiment, lower cell plates 6A, 6B reach the top surfaces of embedded interconnections 5D, 5G, respectively. Embedded interconnections 5D, 5G have thicknesses greater than those of lower cell plates 6A, 6B. More specifically, lower cell plates 6A, 6B have the thicknesses in a range from about 50 nm to about 200 nm, and the interlayer insulating film 9 has the thickness in a range from about 200 nm to about 500 nm in accordance with the thicknesses of lower cell plates 6A, 6B. Embedded interconnections 5D, 5G have the thicknesses in a range from about 200 nm to about 500 nm as does interlayer insulating film 9.

When interlayer insulating film 9 and embedded interconnections 5D, 5G are made to have thicknesses of greater than a certain value, embedded interconnections 5D, 5G can be formed by CMP (Chemical Mechanical Polishing) or the like. As a result, the lower cell plates can be formed on a plane having fewer steps, so that a capacitor having certain capacitance can be formed stably.

Hereinafter, manufacturing steps of memory cell 1 of the SRAM shown in FIG. 15 will be described with reference to FIGS. 16-21.

FIGS. 16-21 are cross sectional views corresponding to that of FIG. 15, showing the respective steps to reach the state of FIG. 15.

Figure 16:
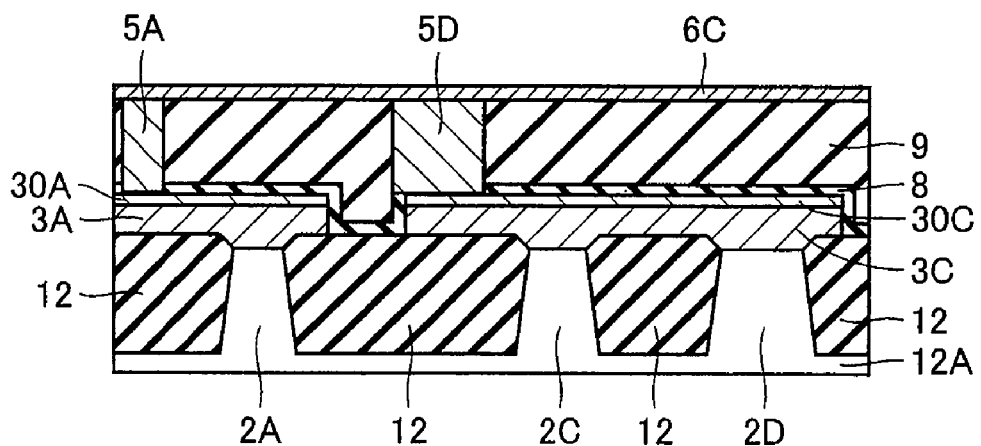
FIGS. 16-21 are cross sectional views showing first through sixth steps in the manufacturing process of the SRAM memory cell of the third embodiment, each corresponding to the cross section of FIG. 15.

As shown in FIG. 16, element isolating insulating layers 12 are selectively formed on a main surface of a semiconductor substrate 12A, to designate active regions 2. Polysilicon interconnections 3 (3A, 3C in FIG. 5) to be gate electrodes, silicide films 30 (30A, 30C in FIG. 5) and nitride films 8 are formed in active regions 2, with gate insulating layers (not shown) interposed between active regions and gate electrodes.

Next, an interlayer insulating film 9 is formed to cover nitride film 8. A contact hole 4C is formed to penetrate nitride film 8 and interlayer insulating layer 9, and an embedded interconnection 5D is formed in contact hole 4C. Other embedded interconnections 5 are formed in the same manner.

A conductive film 6C of a conductive material, such as TiN, polysilicon or the like, is deposited to cover interlayer insulating film 9. When polysilicon is used for conductive film 6C, it is preferably doped with impurities, such as P, for the purpose of reducing resistance. The state shown in FIG. 16 is attained through the above steps.

Figure 17:
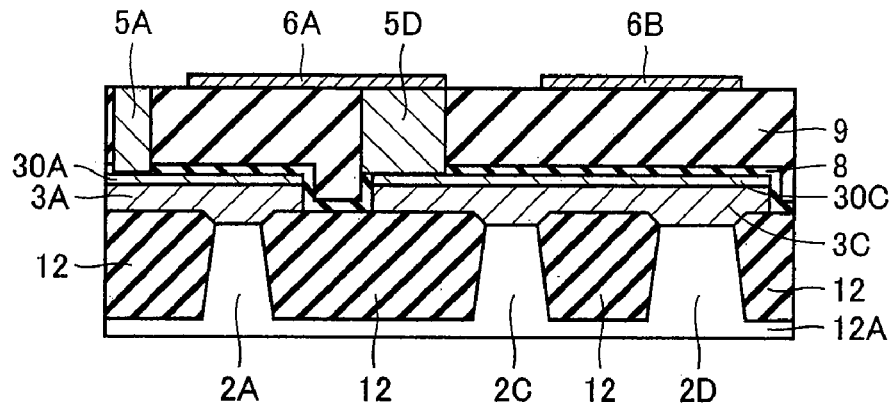

A resist is then applied on conductive film 6C, and a pattern is transferred to the resist using a photo mask. Thereafter, conductive layer 6C is patterned by etching, and thus, lower cell plates 6A, 6B are formed as shown in FIG. 17.

Figure 18:
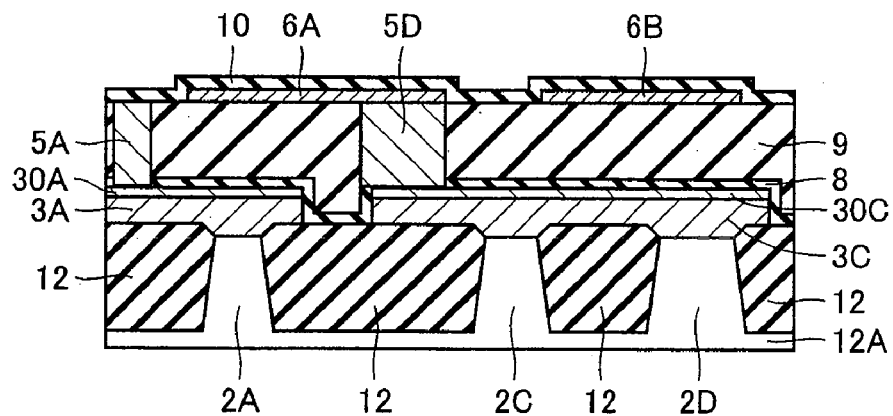

A dielectric film 10 is deposited to cover lower cell plates 6A, 6B, as shown in FIG. 18. SiN, $SiO_2$ or the like is used as dielectric film 10. Dielectric film 10 may also function as an etching stopper during patterning for formation of upper cell plates 7A, 7B.

Dielectric film 10 is thinner than interlayer insulating film 9. This facilitates formation of contact holes 4A, 4B in dielectric film 10.

Figure 19:
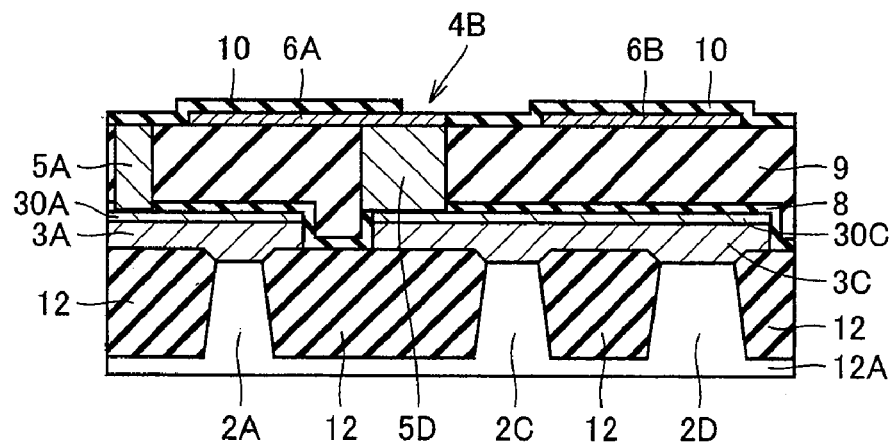

As shown in FIG. 19, dielectric film 10 is patterned to form a contact hole 4 (4B in FIG. 19) for connecting lower and upper cell plates 6, 7.

Figure 20:
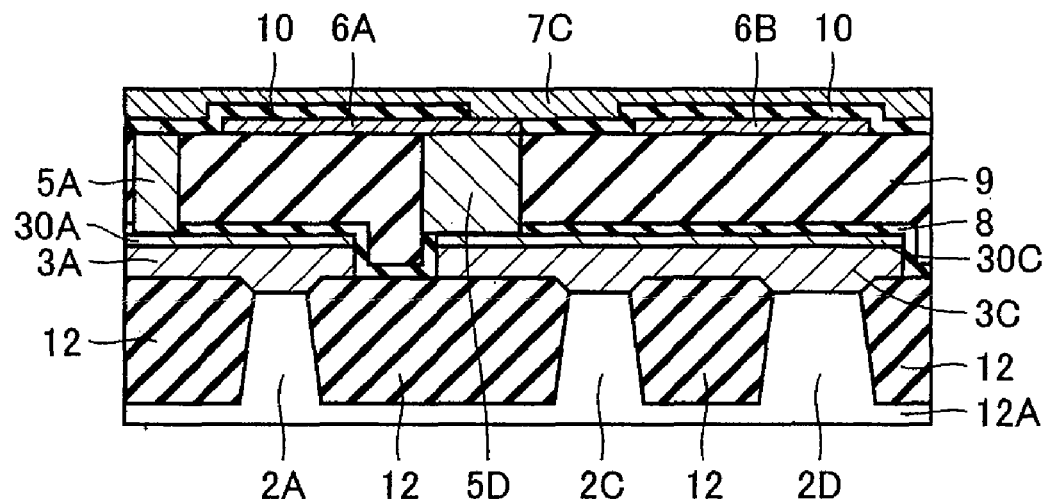

A conductive film 7C of a conductive material, such as TiN, polysilicon or the like, is deposited to cover dielectric film 10, as shown in FIG. 20. When polysilicon is used for conductive film 7C, it is preferably doped with impurities, such as P, for reducing the resistance.

Figure 21:
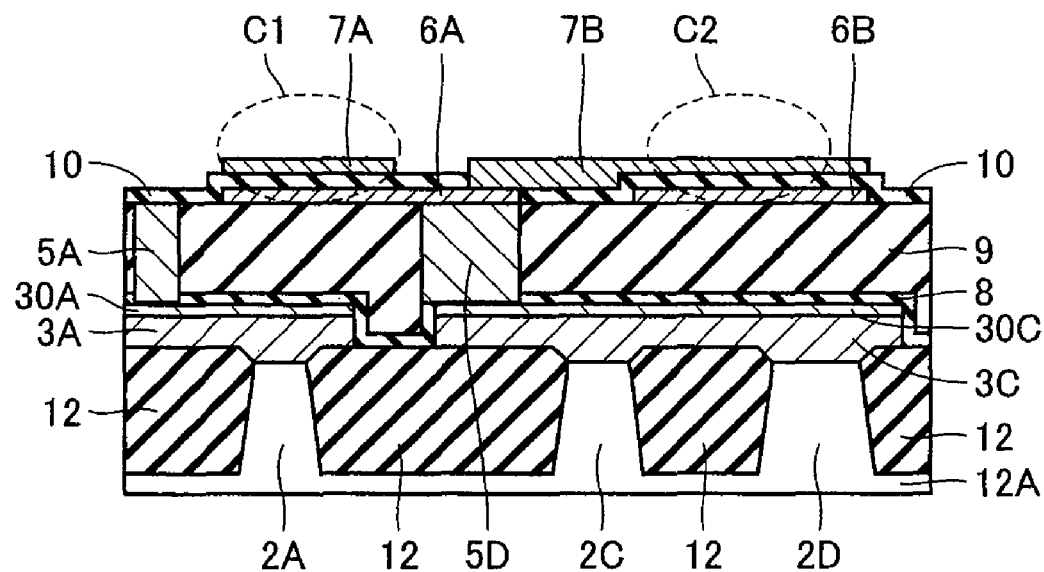

With a resist applied on conductive film 7C, a photo mask is used to transfer a pattern to the resist. Thereafter, conductive layer 7C is patterned by etching, and upper cell plates 7A, 7B are formed as shown in FIG. 21. As such, capacitors C1, C2 are formed by lower and upper cell plates 6, 7.

Thereafter, an interlayer insulating film 11A is deposited to cover upper cell plates 7A, 7B, and first metal interconnections 13 (13A-13G) are formed on interlayer insulating film 11A. Further, an interlayer insulating film 11B is deposited to cover first metal interconnection 13, and second metal interconnections 15 (15A-15E) are formed on interlayer insulating film 11B. As such, the structure shown in FIG. 15 is obtained.

For lower and upper cell plates 6, 7, besides the single-layer structure of polysilicon layer or the like as described above, a stacked-layered structure of polysilicon layer and silicide layer, or a stacked-layered structure of a metal layer and another conductive layer may be employed. This can reduce resistance of lower and upper cell plates 6, 7.

Figure 22:
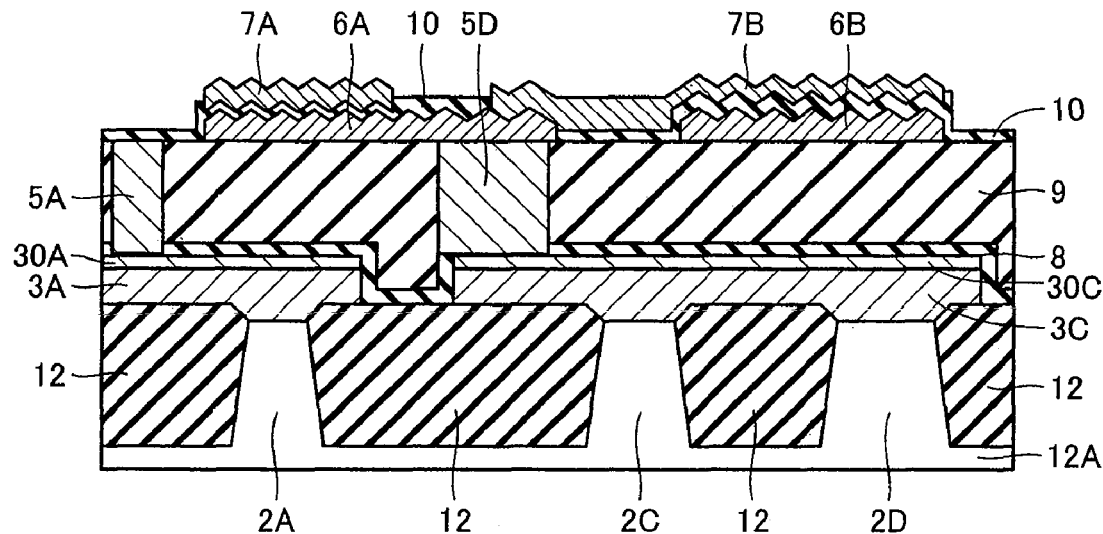
FIG. 22 is a cross sectional view showing a modification of the SRAM memory cell according to the third embodiment of the present invention, corresponding to the cross section of FIG. 15.

Further, at the time of formation of lower and upper cell plates 6, 7, the surfaces of cell plates 6, 7 may be roughened, as shown in FIG. 22, to increase the capacitance of capacitors C1, C2 on a memory cell of the same area. This can further improve the soft-error tolerance of the SRAM.

The configuration of the SRAM described above can be stated differently as follows. The SRAM (semiconductor memory device) according to the present embodiment includes: memory cell 1 having first driver MOS transistor N1 and first access MOS transistor N3 formed in a P-well region (first well region), first and second load MOS transistors P1, P2 formed in an N-well region (second well region), and second driver MOS transistor N2 and second access MOS transistor N4 formed in a P-well region (third well region); embedded interconnection 5D (first local interconnection) formed in interlayer insulating film 9 covering MOS transistors N1-N4, P1, P2, and connecting the sources/drains of first driver MOS transistor N1, first access MOS transistor N3 and first load MOS transistor P1 with the gate electrodes of second driver MOS transistor N2 and second load MOS transistor P2; embedded interconnection 5G (second local interconnection) formed in interlayer insulating film 9 and connecting the sources/drains of second driver MOS transistor N2, second access MOS transistor N4 and second load MOS transistor P2 with the gate electrodes of first driver MOS transistor N1 and first load MOS transistor P1; first capacitor C1 provided on interlayer insulating film 9 and connected to embedded interconnection 5D, 5G; second capacitor C2 provided on interlayer insulating film 9 and connected to embedded interconnection 5D, 5G; and word line WL, bit lines BL1, BL2, the ground lines (GND lines) and the power supply line (VDD line) formed in a layer upper than that of first and second capacitors C1, C2.

Providing the layer including the word line, bit lines, ground lines and power supply line in the layer upper than first and second capacitors C1, C2 can improve reliability of the first and second capacitors. Thus, it is possible to obtain an SRAM having high soft-error tolerance.

The structure of the present embodiment is now compared with that of the first embodiment in terms of the capacitance of capacitors C1, C2. In the present embodiment, each of storage nodes NA, NB is added with two capacitors, and thus, the total capacitance of the capacitors added to storage nodes NA, NB is twice that of the case where one capacitor is added to each of storage nodes NA, NB (first embodiment). With the Miller effect as described above, the capacitance of capacitors C1, C2 each increases to the extent up to about two times.

On the other hand, in the present embodiment, the upper cell plate is divided into two parts spaced apart from each other, as shown in FIG. 11. Thus, by estimation, the area of upper cell plate 7 (7A, 7B) is about 0.7 times that of the first embodiment in a memory cell of the same area.

Thus, in the memory cell of the SRAM according to the present embodiment, with the Miller effect expected, the capacitance of about 2.8 times ($2\times2\times0.7=2.8$) that of the first embodiment can be secured in a memory cell of the same area.

Meanwhile, the memory cell of the present embodiment has three partitioned wells arranged side by side in the direction along which the word line extends, and is longer in the word line extending direction than in the bit line extending direction (so-called lateral type cell).

In such a lateral type cell, with three wells formed, the first and second storage nodes (NA, NB) are located in different wells. Here, when charges due to an α ray or the like causing a soft error enter a well in which one storage node is located, the other storage node located in another well partitioned by an element isolating region hardly suffers the influence of the charges. Thus, only the one storage node is affected by the charges, in which case the influence causing the soft error would not be alleviated.

By comparison, when a capacitor joined to both storage nodes is provided, the two storage nodes are connected to each other via the capacitor. Thus, when the potential of the storage node at the H level side decreases, the potential of the storage node at the L level side also decreases. This can suppress the abrupt change in potential of only one of the storage nodes, and as a result, the soft-error tolerance improves. As such, the configuration of the present embodiment is particularly effective for the lateral type cell.

The characteristic of the lateral type cell is now described from another viewpoint. Generally, when charges are abruptly introduced into a well in a manner possibly causing a soft error, the charges will propagate into another memory cell within the same well partitioned by element isolating films.

In a cell structure having partitioned wells arranged side by side in the bit line extending direction (longitudinal type cell structure), the soft error is more likely to propagate in the word line extending direction. In the case of the longitudinal type cell, there is a high possibility of occurrence of soft errors in many (for example, three or more) memory cells in the same word line (so-called multi-bit failure). Thus, assuming that a parity bit incorporating an ECC (Error Correction Code) circuit is provided for each word line, a large number of parity bits are required for each word line, which is disadvantageous from the standpoints of miniaturization of the chip and acceleration of the operation.

By comparison, the memory cell of the present embodiment is a lateral type cell in which partitioned wells are arranged side by side in the word line extending direction. This can prevent the soft error from propagating in the word line direction, and can lessen the number of parity bits that should be connected to each word line. As a result, it is possible to provide an SRAM having high soft-error tolerance, while more efficiently downsizing the chip and increasing the operating speed.

As to the thicknesses of lower and upper cell plates 6, 7 set in the range as described above, when lower cell plate 6 (6A, 6B) is formed to be thicker than upper cell plate 7 (7A, 7B), the side face of lower cell plate 6 can be covered with the dielectric film and upper cell plate 7. This makes it possible to form a capacitor at the side face portion as well, to thereby increase the capacitance of the capacitors.

When upper cell plate 7 is thickened, the resistance of upper cell plate 7 can be lowered, in which case upper cell plate 7 can be used as the interconnection for a peripheral circuit.

Polysilicon, for example, may be used for lower cell plate 6, and a stacked-layered structure of polysilicon and silicide (hereinafter, referred to as a "polycide structure") may be used for upper cell plate 7. Use of the polycide structure for lower cell plate 6 is inappropriate from the standpoint of ensuring insulation of the capacitor dielectric film.

With the configuration described above, in the memory cell of the SRAM according to the present embodiment, in the lateral type cell longer in the word line extending direction than in the bit line extending direction, the areas on the driver MOS transistors, access MOS transistors and load MOS transistors can be used more efficiently than in the first embodiment, to form capacitors to be added to the storage nodes for the purpose of improving the soft-error tolerance. Accordingly, it is possible to further enhance the effect of improving the soft-error tolerance while suppressing the increase in area of memory cell 1.

More specifically, in a memory cell having a cell size of 1 $\mu m^2$ (2 $\mu m\times0.5$ $\mu m$), a gate length of 0.13 $\mu m$ and a power supply voltage of 1.8 V, capacitance of about 2.4 fF can be added for one storage node. Here, the thickness of the dielectric film sandwiched between the lower and upper cell plates may be, for example, about 15 nm.

Further, contact holes 4A, 4B for connecting lower and upper cell plates 6, 7 are formed on embedded interconnections 5D, 5G (first and second local interconnections), respectively, so that the relevant interconnections 5D, 5G serve as etching stoppers at the formation of contact holes 4A, 4B. This prevents penetration of interlayer insulating film 9 during the formation of the relevant contacts 4A, 4B, which would otherwise damage the MOS transistors.

In the present embodiment, detailed description of the matters similar to those of the first embodiment is not repeated.

Although the case of forming memory cell 1 on a semiconductor substrate has been described above, the above-described structure may also be applied to the case where a semiconductor layer is arranged on a substrate with an insulating layer interposed therebetween (so-called SOI (Semiconductor on Insulator) structure). The same applies to any embodiment described above or below.

Fourth Embodiment

Figure 23:
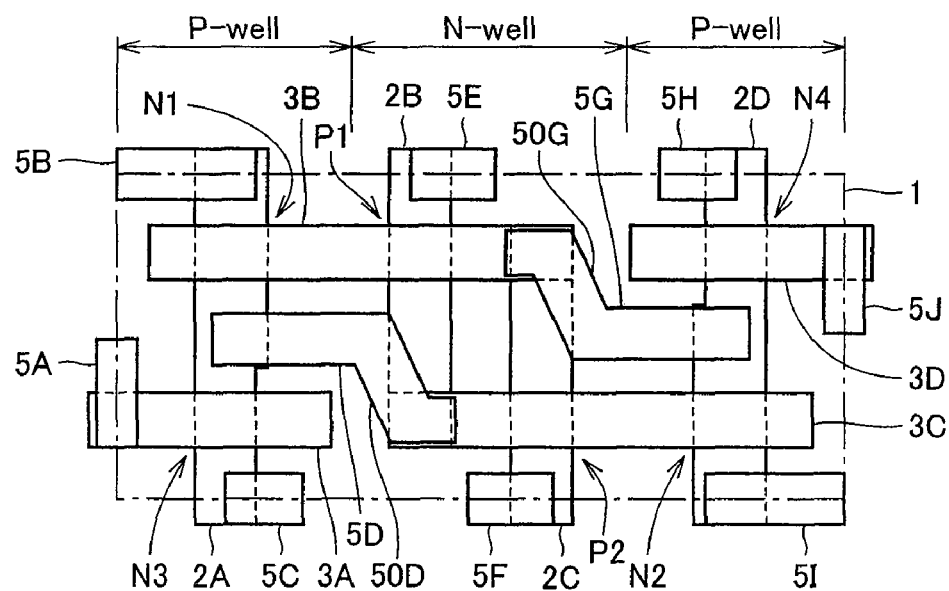
FIG. 23 shows a layout configuration of an SRAM memory cell according to a fourth embodiment of the present invention.
Figure 24:
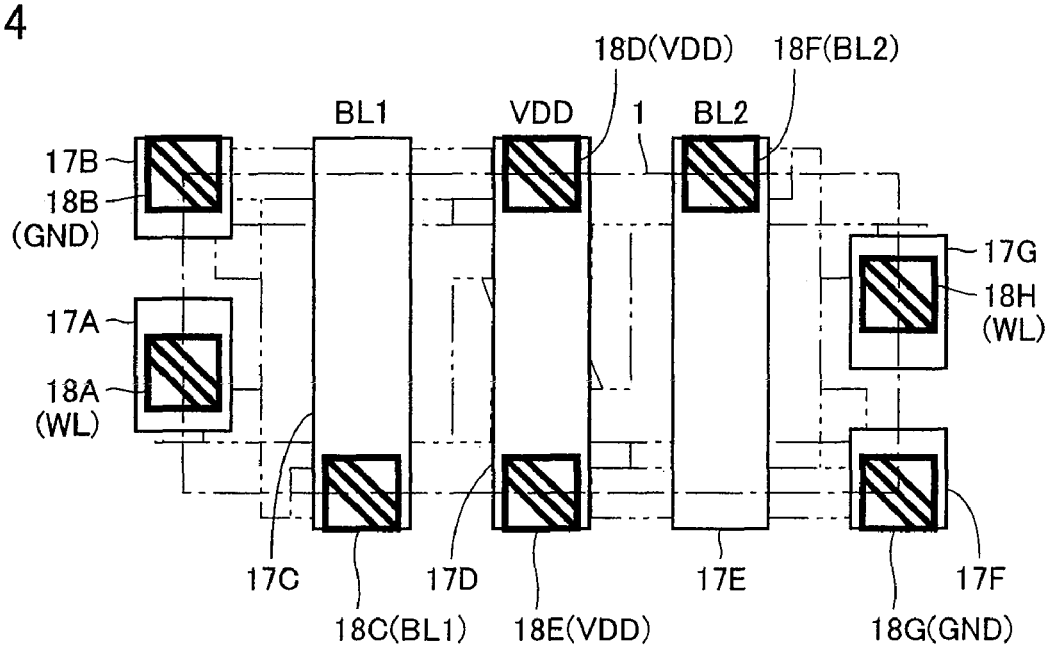
FIGS. 24 and 25 are layout diagrams showing upper layer metal interconnections of the SRAM memory cell of the fourth embodiment, showing layout configurations of first and second metal interconnection layers, respectively.
Figure 25:
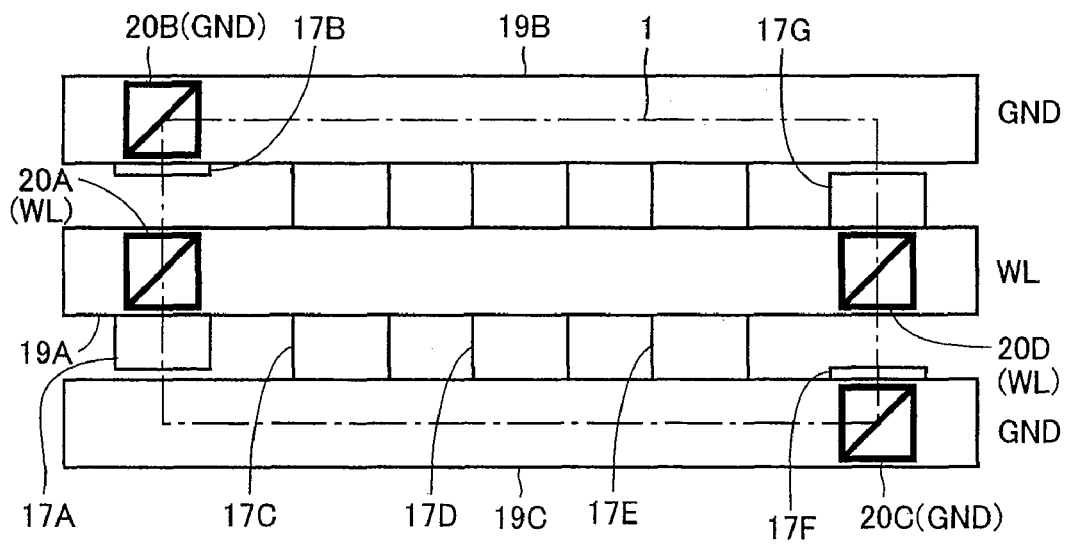

FIGS. 23-25 are top plan views of a memory cell 1 of a full CMOS SRAM as a semiconductor memory device according to a fourth embodiment of the present invention. FIG. 23 shows the layout up to embedded interconnections including the storage nodes formed in an interlayer insulating film. FIG. 24 shows arrangement of first layer metal interconnections 17A-17G formed above the embedded interconnections. FIG. 25 shows arrangement of second metal interconnections 19A-19C formed above the first metal interconnections.

The semiconductor memory device according to the present embodiment is a modification of the semiconductor memory device of the third embodiment described above, and differs from the third embodiment in that the bit lines are arranged in a layer lower than that of the word lines, as shown in FIGS. 23-25.

In FIG. 23, embedded interconnection 5E connected to a VDD line extends from above active region 2B in the word line direction toward active region 2C, taking account of contact with the VDD line. Similarly, embedded interconnection 5F extends from above active region 2C in the word line direction toward active region 2B. Otherwise, the layout of the present embodiment is similar to each of the embodiments described above.

Referring to FIGS. 24 and 25, bit lines BL1, BL2 are arranged in the layer lower than that of word line WL. Specifically, upper cell plates 7A, 7B are formed on lower cell plates 6A, 6B, a first metal interconnection layer including bit lines BL1, BL2 is formed on upper cell plates 7A, 7B, and a second metal interconnection layer including word line WL is formed on the first metal interconnection layer.

In FIG. 24, interconnections 17C, 17E to be bit lines BL1, BL2 are connected to embedded interconnections 5C, 5H through via holes 18C, 18F, respectively. Interconnection 17D to be a VDD line is connected to interconnection 5E through a via hole 18D and connected to interconnection 5F through a via hole 18E. Interconnections 17A, 17G are connected to embedded interconnections 5A, 5J through via holes 18A, 18H, respectively, and interconnections 17B, 17F are connected to embedded interconnections 5B, 5I through via holes 18B, 18G, respectively.

In FIG. 25, interconnections 17A, 17G are connected to interconnection 19A to be a word line, through via holes 20A, 20D, respectively. Interconnections 17B, 17F are connected to interconnections 19B, 19C to be GND lines, through via holes 20B, 20C, respectively.

In the present embodiment, detailed description of the matters similar to those of each of the above-described embodiments is not repeated.

In the present embodiment as well, it is possible to obtain an SRAM having high soft-error tolerance, as in any of the above-described embodiments.

Further, in the metal interconnections, the lower layer interconnection is generally thinner than the upper layer interconnection. Arranging the bit lines in the layer lower than that of the word lines can reduce the bit capacitance, enabling a faster operation.

Fifth Embodiment

Figure 27:
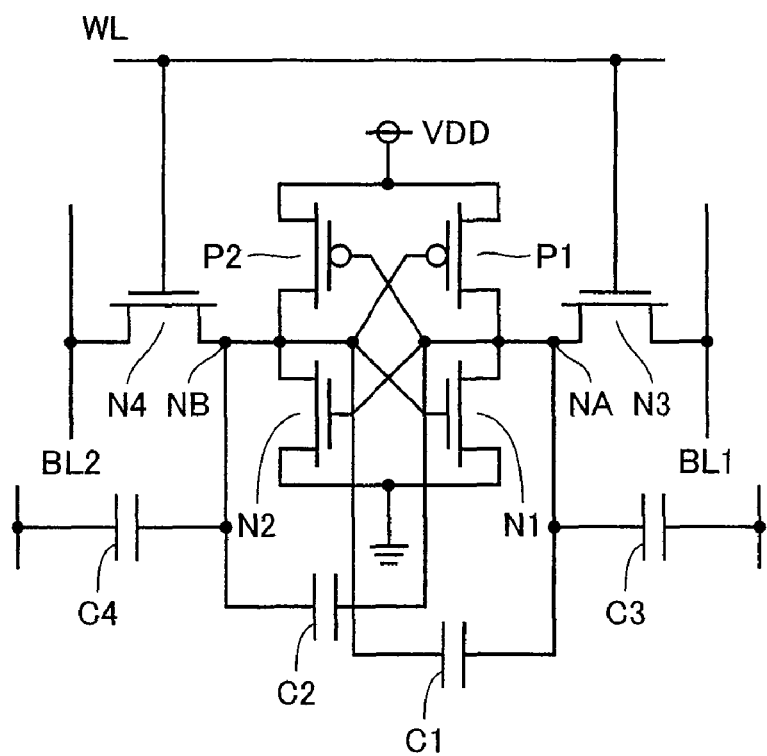
FIG. 27 is an equivalent circuit diagram of the SRAM memory cell of the fifth embodiment.

FIG. 27 is an equivalent circuit diagram of a memory cell 1 of a full CMOS SRAM as a semiconductor memory device according to a fifth embodiment of the present invention.

The semiconductor memory device of the present embodiment is a modification of the semiconductor memory device according to the third embodiment described above, and differs from the third embodiment in that capacitors C3, C4 are provided in addition to capacitors C1, C2 described above.

Figure 26:
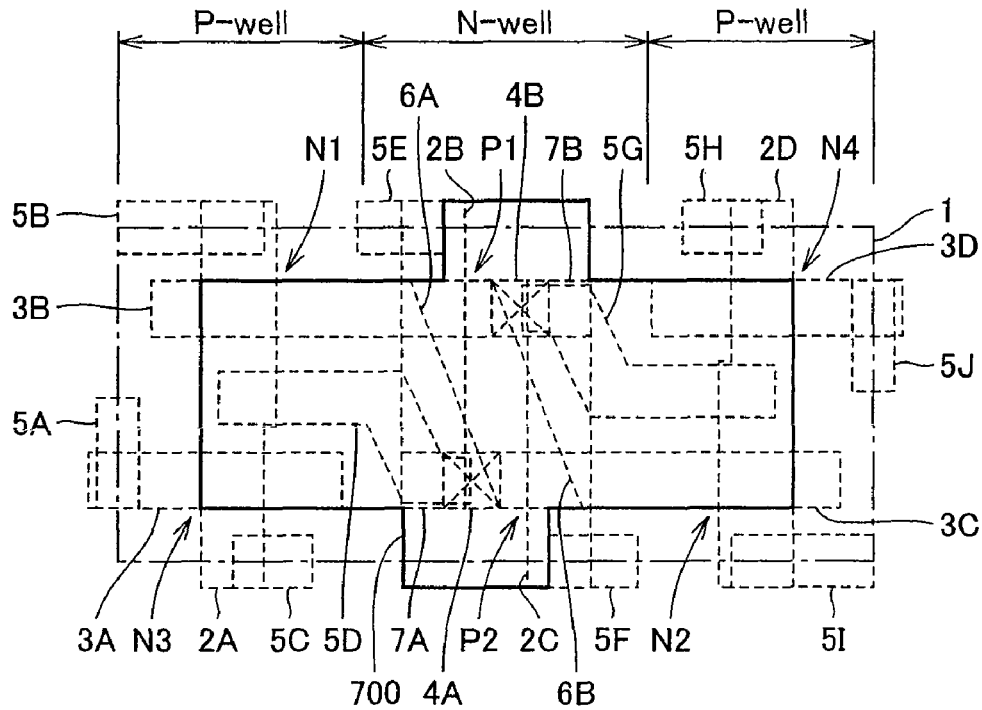
FIG. 26 shows a cell plate that is formed above the upper cell plate of the capacitor in an SRAM memory cell according to a fifth embodiment of the present invention.

FIG. 26 is a top plan view of memory cell 1 of the full CMOS SRAM.

Referring to FIG. 26, a cell plate 700 (third upper cell plate) is formed in a layer upper than that of upper cell plate 7, with a dielectric film interposed therebetween. Cell plate 700 is formed to cover upper cell plates 7A, 7B.

As a result, capacitors C3, C4 are formed by upper cell plates 7A, 7B and cell plate 700. Cell plate 700 is connected to a power supply line or a GND line.

With this configuration, a memory cell structure corresponding to the equivalent circuit shown in FIG. 27 is obtained. This can further increase the capacitance of the capacitors added to storage nodes NA, NB, and further enhance the effect of preventing the soft errors.

Figure 28:
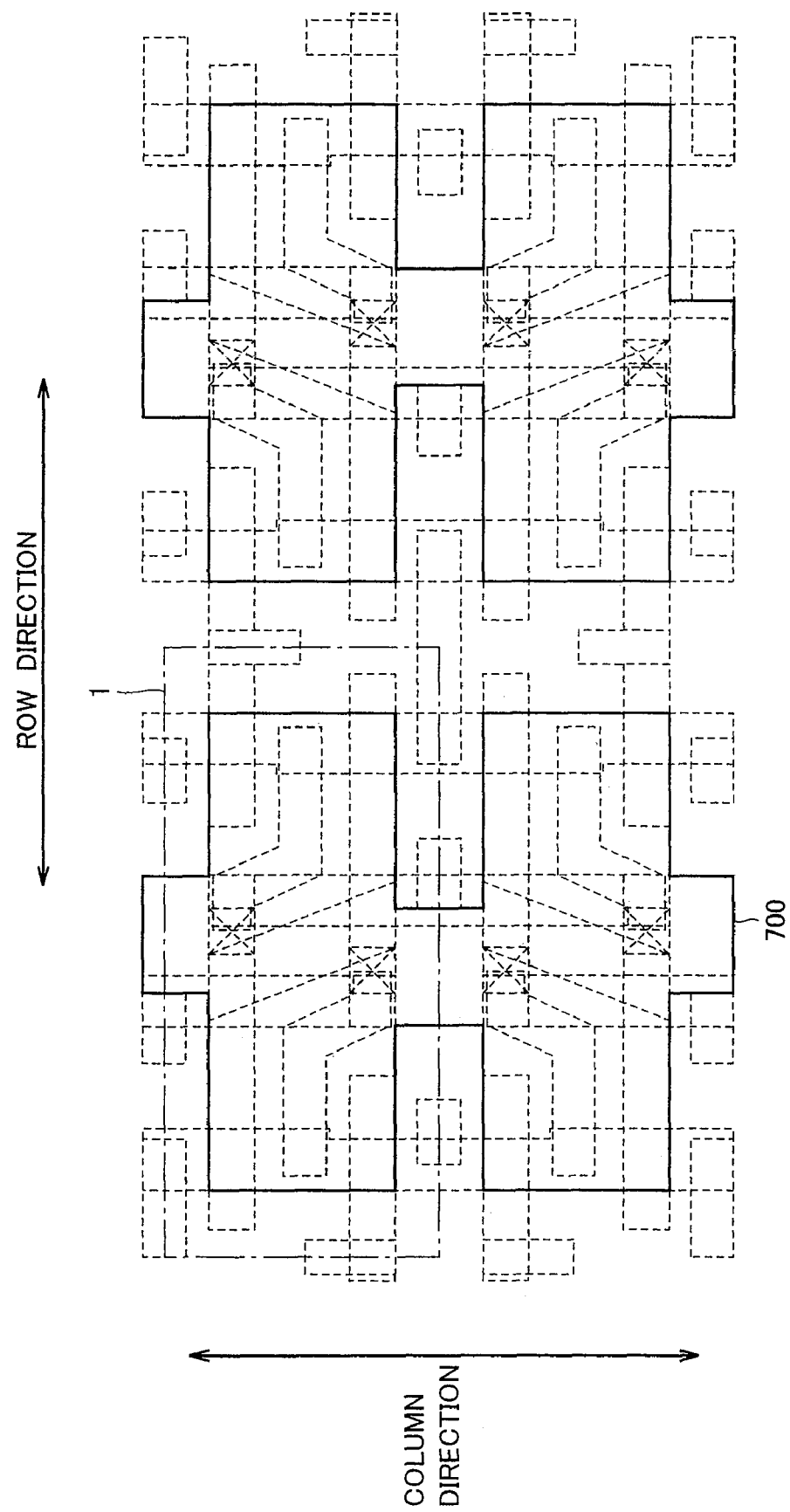
FIG. 28 shows the state where SRAM memory cells each as shown in FIG. 26 are arranged collectively.

FIG. 28 is a top plan view of the state where memory cells 1 described above are arranged collectively. The longitudinal direction in FIG. 28 corresponds to the column direction in which the bit lines extend, and the lateral direction in FIG. 28 corresponds to the row direction in which the word lines extend.

Referring to FIG. 28, cell plate 700 can be made to extend over a plurality of memory cells.

Although the case of forming cell plate 700 on the memory cell(s) of the SRAM of the third embodiment has been described in conjunction with FIGS. 26-28, it may be formed on the memory cell(s) according to the first or second embodiment. In such a case as well, the similar effect as described above can be enjoyed.

In the present embodiment, detailed description of the matters similar to those of the embodiments described above is not repeated.

Sixth Embodiment

Figure 29:
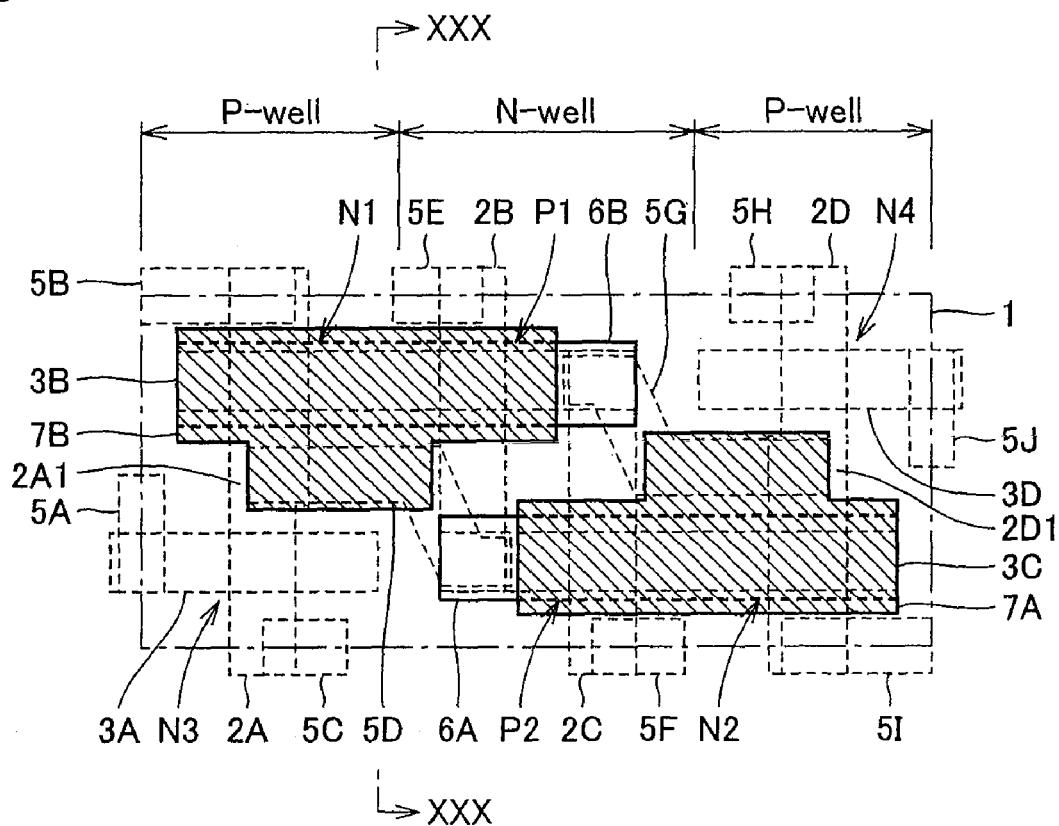
FIG. 29 shows layout configurations of lower and upper cell plates of a capacitor formed in an SRAM memory cell according to a sixth embodiment of the present invention.
Figure 30:
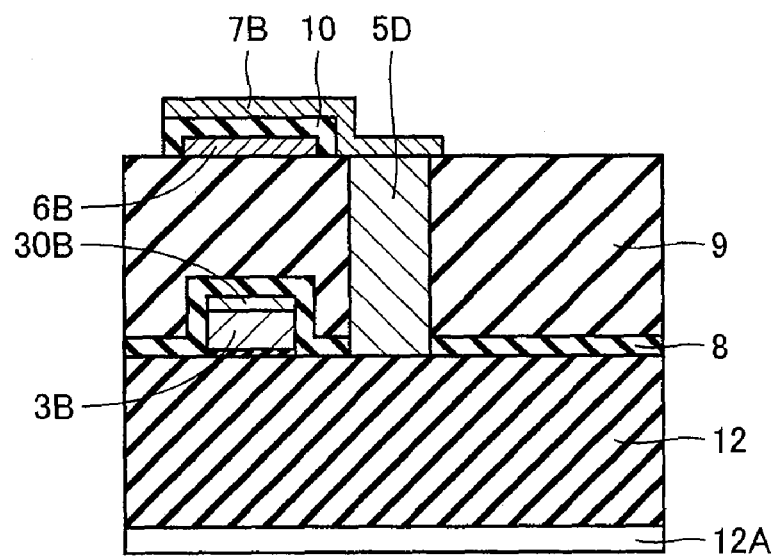
FIG. 30 is a cross sectional view taken along the line XXX-XXX in FIG. 29.

FIG. 29 is a top plan view showing the layout of a memory cell 1 of a full CMOS SRAM as a semiconductor memory device according to a sixth embodiment of the present invention. FIG. 30 is a cross sectional view taken along the line XXX-XXX in FIG. 29. The semiconductor memory device according to the present embodiment is a modification of the semiconductor memory device of the third embodiment, and differs from the third embodiment in the layout of lower and upper cell plates 6, 7.

Referring to FIGS. 29 and 30, lower cell plates 6A, 6B are formed to cover parts of embedded interconnections 5D, 5G, respectively, and connected to the respective interconnections 5D, 5G. Upper cell plates 7A, 7B are formed on lower cell plates 6A, 6B, respectively. Lower and upper cell plates 6A, 7A form a capacitor C1, and lower and upper cell plates 6B, 7B form a capacitor C2. Upper cell plates 7A, 7B are formed to cover parts of embedded interconnections 5G, 5D, respectively, and connected to the respective interconnections 5G, 5D.

The structure of the SRAM of the present embodiment is now compared with that of the third embodiment. In the SRAM according to the third embodiment, capacitor C1 (first capacitor) is formed on a region (first region) including the gate electrode of first driver MOS transistor N1 and active region 2A1 shared by first driver MOS transistor N1 and first access MOS transistor N3, and capacitor C2 (second capacitor) is formed on a region (second region) including the gate electrode of second driver MOS transistor N2 and active region 2D1 shared by second driver MOS transistor N2 and second access MOS transistor N4. In contrast, in the SRAM of the present embodiment, capacitor C2 (second capacitor) is formed on the first region described above, and capacitor C1 (first capacitor) is formed on the second region.

In the present embodiment as well, with the configuration described above, two capacitors C1, C2 are connected to each of storage nodes NA, NB, as in the case of the third embodiment. Further, capacitors C1, C2 are connected between the inputs and the outputs of the inverters, so that the Miller effect as described above is expected. Accordingly, in the present embodiment as well, the area at the center portion of memory cell 1 can be used efficiently to form capacitors of large capacitance so as to improve the soft-error tolerance.

In the present embodiment, detailed description of the matters similar to those of the above-described embodiments is not repeated.

It should be noted that it has been intended from the beginning to combine any of the characteristic portions of the above-described embodiments of the present invention as appropriate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
a word line;
a bit line extending in a direction orthogonal to an extending direction of said word line; and
a memory cell longer in the extending direction of said word line than in an extending direction of said bit line;
said memory cell including
a first well region of a first conductivity type, a second well region of a second conductivity type and a third well region of the first conductivity type arranged side by side in the extending direction of said word line,
a first driver MOS transistor and a first access MOS transistor formed on said first well region,
first and second load MOS transistors formed on said second well region,
a second driver MOS transistor and a second access MOS transistor formed on said third well region,
a first local interconnection formed in an interlayer insulating film covering said first and second driver MOS transistors, said first and second access MOS transistors and said first and second load MOS transistors, connecting active regions of said first driver MOS transistor, said first access MOS transistor and said first load MOS transistor with gate electrodes of said second driver MOS transistor and said second load MOS transistor, and having a slanting portion extending in a direction crossing a longitudinal direction of a conductive layer that is to be the gate electrodes of said second driver MOS transistor and said second load MOS transistor at an obtuse angle when seen from above said interlayer insulating film,
a second local interconnection formed in said interlayer insulating film, connecting active regions of said second driver MOS transistor, said second access MOS transistor and said second load MOS transistor with gate electrodes of said first driver MOS transistor and said first load MOS transistor, and having a slanting portion extending in a direction crossing a longitudinal direction of another conductive layer that is to be the gate electrodes of said first driver MOS transistor and said first load MOS transistor at an obtuse angle when seen from above said interlayer insulating film,
first and second lower plates formed spaced apart from each other on said interlayer insulating film to cover the slanting portions of said first and second local interconnections, respectively, and having slanting edge portions extending along said slanting portions, and
an upper plate formed on said first and second lower plates with a dielectric film interposed therebetween, to form first and second capacitors together with said first and second lower plates, respectively.

2. The semiconductor memory device according to claim 1, wherein
said first and second local interconnections are embedded interconnections that are embedded in said interlayer insulating film,
said first and second lower plates reach said first and second local interconnections, respectively, and
said embedded interconnections are thicker than said first and second lower plates.

3. The semiconductor memory device according to claim 1, wherein
said first and second local interconnections are embedded interconnections that are embedded in said interlayer insulating film, and
said first and second lower plates are extended on said first and second local interconnections to come into contact with surfaces of said first and second local interconnections, respectively.

4. The semiconductor memory device according to claim 1, wherein said first capacitor is formed on one of a region including the gate electrode of said first driver MOS transistor and the active region common to said first driver MOS transistor and said first access MOS transistor and a region including the gate electrode of said second driver MOS transistor and the active region common to said second driver MOS transistor and said second access MOS transistor, and said second capacitor is formed on the other of the regions.

5. The semiconductor memory device according to claim 1, wherein said bit line is arranged in a layer lower than that of said word line.

* * * * *